(12) United States Patent
Shibata

(10) Patent No.: US 7,196,933 B2
(45) Date of Patent: Mar. 27, 2007

(54) HIGH-SPEED VERIFIABLE SEMICONDUCTOR MEMORY DEVICE

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/297,467

(22) Filed: Dec. 9, 2005

(65) Prior Publication Data

US 2006/0126392 A1 Jun. 15, 2006

(30) Foreign Application Priority Data

Dec. 10, 2004 (JP) ............................. 2004-359029

(51) Int. Cl.
*G11C 16/04* (2006.01)
(52) U.S. Cl. .................... 365/185.22; 365/185.03
(58) Field of Classification Search .......... 365/185.22, 365/185.03, 185.18
See application file for complete search history.

(56) References Cited

U.S. PATENT DOCUMENTS

| | | | |
|---|---|---|---|
| 5,936,971 A * | 8/1999 | Harari et al. ................ 714/710 |
| 6,643,188 B2 | 11/2003 | Tanaka et al. |
| 6,683,810 B2 * | 1/2004 | Sakamoto ............... 365/185.22 |
| 6,707,719 B2 | 3/2004 | Shibata et al. |
| 2004/0170056 A1 | 9/2004 | Shibata et al. |
| 2005/0169057 A1 | 8/2005 | Shibata et al. |

FOREIGN PATENT DOCUMENTS

| | | |
|---|---|---|
| JP | 2000-195280 | 7/2000 |
| JP | 2003-196988 | 7/2003 |

* cited by examiner

*Primary Examiner*—Vu A. Le
(74) *Attorney, Agent, or Firm*—Oblon, Spivak, McClelland, Maier & Neustadt, P.C.

(57) ABSTRACT

A memory cell stores several data using n (n: natural number more than 1) threshold voltages. A voltage supply circuit supplies a predetermined voltage to a gate of the memory cell in a verify operation of verifying whether or not the memory cell reaches a predetermined threshold voltage. A detection circuit connected to one terminal of the memory cell charges one terminal of the memory cell to a predetermined potential. The detection circuit detects the voltage of one terminal of the memory cell based on a first detection timing, and further, detects the voltage of one terminal of the memory cell based on a second detection timing.

26 Claims, 26 Drawing Sheets

(Program)

| | "1" data write | "0" data write, high in first verify | "0" data write, low in first verify | |
|---|---|---|---|---|
| PDC | 1 | 0 | 0 | 1: non-write  0: write |
| DDC | 1 | 1 | 0 | Bit line when PDC=0, 1: intermediate potential, 0: Vss |

FIG. 11A

(After first time verify)

| | Memory cell (1) | Memory cell (2) | Memory cell (3) (4) |
|---|---|---|---|
| PDC | 1 | 0 | 1 |
| DDC | 1 | 0 | 0 |

FIG. 11B

(After second time verify)

| | Memory cell (1) | Memory cell (2) | Memory cell (3) | Memory cell (4) |
|---|---|---|---|---|
| PDC | 1 | 0 | 0 | 1 |
| DDC | 1 | 0 | 1 | 1 |

FIG. 11C

(After program recovery, after PDC data is inverted)

| | Data "1" write | Data "0" write, high in first time verify | Data "0" write, low in first time verify | |
|---|---|---|---|---|
| PDC | 0 | 1 | 1 | 0: Non-write, 1: write |
| DDC | 1 | 1 | 0 | Bit line when PDC = 0, 1: intermediate potential, 0: Vss |

F I G. 16

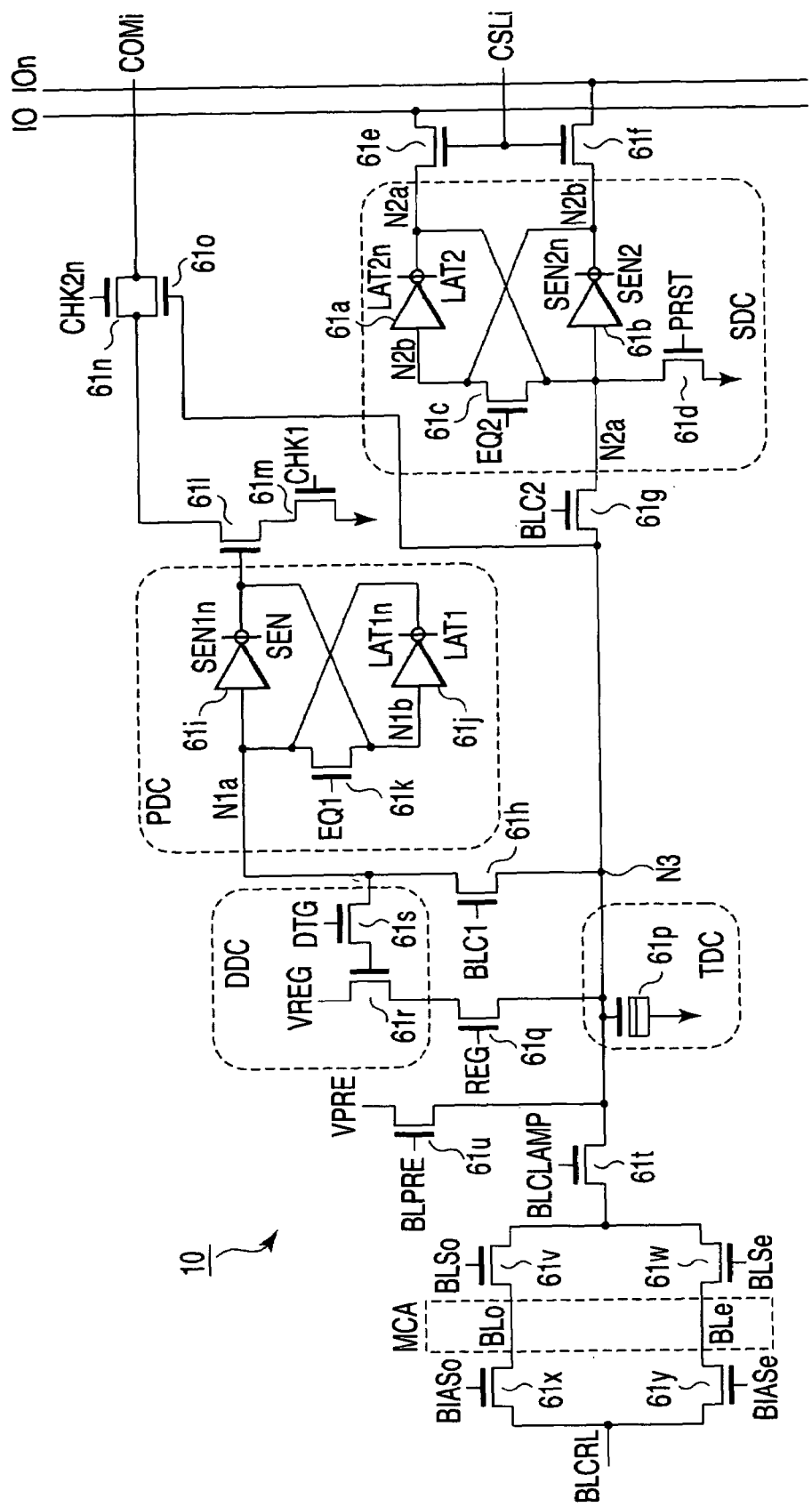
F I G. 18

HIGH-SPEED VERIFIABLE SEMICONDUCTOR MEMORY DEVICE

CROSS-REFERENCE TO RELATED APPLICATIONS

This application is based upon and claims the benefit of priority from prior Japanese Patent Application No. 2004-359029, filed Dec. 10, 2004, the entire contents of which are incorporated herein by reference.

BACKGROUND OF THE INVENTION

1. Field of the Invention

The present invention relates to a semiconductor memory device, which is capable of storing binary or more data in one memory cell.

2. Description of the Related Art

There has been proposed a NAND flash memory using an EEPROM, that is, a non-volatile semiconductor memory device capable of storing multi-valued data in one memory cell (e.g., see JPN. PAT. APPLN. KOKAI Publication No. 2000-195280).

The NAND flash memory is configured in a manner that all or half of several memory cells arrayed in a row direction are each connected to the corresponding latch circuit via a bit line. The latch circuit holds data in data write and read. The foregoing all or half of cells arrayed in the row direction collectively write and read data (e.g., see JPN. PAT. APPLN. KOKAI Publication No. 2003-196988).

Quick Pass Write (QPW) has been proposed as a method of preventing a data write time with respect to memory cell from increasing and narrowing a threshold voltage distribution width after data write. According to the QPW, a bit line is charged while a potential (voltage) of word line is set to a level lower than a normal verify level. Thereafter, a select gate is set to a high level, and then, the pre-charged bit line is discharged. In non-write cell and write continuing cell, which are far from a write threshold voltage, the bit line potential becomes a low level because current is carried. On the other hand, in a write continuing cell, which is close to the write threshold voltage and a write completed cell, the bit line is intactly kept high. At that time, the bit line potential is detected (first time verify).

Then, the word line potential is set to a normal word line level. By doing so, in the write continuing cell, the bit line becomes low. Therefore, in the write completed cell only, the bit line potential becomes high. At that time, the bit line potential is detected (second time verify).

According to the result of the second time verify, a cell becoming high is a write completed cell. The write completed cell is regarded as a non-write cell in the next program loop, and therefore, it sets the bit line to a power supply voltage Vdd, and does not carry out a write operation. On the other hand, according to the result of the second time verify, a cell becoming low is a write incomplete cell. The write incomplete cell carries out a write operation in the next program loop. However, according to the result of the first time verify, a cell becoming high is a cell, which is close to the threshold voltage (normal verify level). For this reason, the cell sets the bit line to an intermediate potential (e.g., 0.75V), and carries out a write operation in a state of reducing a write speed. On the other hand, according to the result of the first time verify, a cell becoming low sets the bit line to a ground voltage Vss, and carries out a write operation.

In this manner, program and verify are repeated until all write cells pass the second time verify. Therefore, the write speed of the cells closing to a normal verify potential becomes late; as a result, threshold voltage distribution is narrowed.

However, the first time verify operation is made in a state that the word line potential is set to a level lower than a normal verify level. Thereafter, the second time verify operation must be made in a state that the word line potential is set as the normal write verify level. The word line has a large capacity; for this reason, time is taken to step up the word line potential. As a result, there is a problem that the verify time increases. Therefore, it is desired to provide a semiconductor memory device capable of preventing the verify time from increasing.

BRIEF SUMMARY OF THE INVENTION

According to a first aspect of the present invention, there is provided a semiconductor memory device comprising: a memory cell storing data using n threshold voltage (n: natural number more than 1); a voltage supply circuit supplying a predetermined voltage to a gate of the memory cell in a verify operation of verifying whether or not the memory cell reaches a predetermined threshold voltage; and a detection circuit connected to one terminal of the memory cell, the detection circuit charging one terminal of the memory cell to a predetermined potential in the verify operation, detecting a voltage of one terminal of the memory cell at a first detection timing, and detecting a voltage of one terminal of the memory cell at a second detection timing.

According to a second aspect of the present invention, there is provided a semiconductor memory device comprising: a memory cell storing data using n threshold voltage (n: natural number more than 1); a first data storage circuit connected to one terminal of the memory cell, and storing first or second logic level data inputted externally; a second data storage circuit connected to one terminal of the memory cell, and storing the first or second logic level data; and a control circuit connected to the first and second data storage circuits, the control circuit carrying out the following:

a first operation of stepping up the threshold voltage of the memory cell when the first and second data storage circuits are a first logic level; a second operation of stepping up the threshold voltage of the memory cell in a range of the threshold voltage less than the first operation when the second data storage circuits is a second logic level; an operation of charging one terminal of the memory cell while applying a first voltage to a gate of the memory cell in a verify operation of holding the threshold voltage of the memory cell without changing it and verifying whether or not the memory cell reaches a predetermined threshold voltage when the first data storage circuits is a second logic level; and the first operation in a manner of changing the logic level of the second data storage circuit to a second logic level when the voltage of one terminal of the memory cell is more than a first detection level in a first step, and after predetermined time elapses, changing the logic level of the first data storage circuit to a second logic level when the voltage of one terminal of the memory cell is more than a second detection level in a second step.

According to a third aspect of the present invention, there is provided a semiconductor memory device comprising: a memory storing several data using n threshold voltage (n: natural number more than 1); a first data storage circuit connected to one terminal of the memory cell, and storing first or second logic level data input externally; and a control circuit connected to the first data storage circuit, the control circuit carrying out a first operation of stepping up the threshold voltage of the memory cell when the first data storage circuits is a first logic level, charging one terminal of the memory cell when the first data storage circuit is a first logic level while applying a first voltage to a gate of the memory cell without making no charge operation when it is second level in a verify operation of holding the threshold voltage of the memory cell without changing it and verifying whether or not the memory cell reaches a predetermined threshold voltage when the first data storage circuits is a second logic level, and making no first operation in a manner of changing the logic level of the first data storage circuit to a second level when the voltage of one terminal of the memory cell is more than a first detection level.

According to a fourth aspect of the present invention, there is provided a program method of a semiconductor memory device comprising: carrying out a write operation with respect to a memory cell storing data using different threshold voltage, and making no change of a threshold voltage in a next write operation when the memory cell reaches a predetermined first threshold voltage in a verify operation of and verifying whether or not the memory cell reaches a predetermined first threshold voltage; and carrying out an i (i: natural number more than 3) write operation in the next write operation when the memory cell reaches a voltage lower than the predetermined first threshold voltage, that is, i threshold voltage (i: natural number more than 3) (first threshold voltage>second threshold voltage>third threshold voltage . . . >i threshold voltage), and controlling the threshold voltage in the i write operation so that a change becomes small in the order of first threshold voltage<third threshold voltage<fourth threshold voltage< . . . <k threshold voltage, and repeating the write operation and the verify operation until the memory cell reaches the predetermined first threshold voltage.

According to a fifth aspect of the present invention, there is provided a semiconductor memory device comprising: a memory cell array having several memory cells arrayed like a matrix, which are connected to a word line and a bit line and store n value (n: natural number more than 3); and a control circuit controlling each potential of the word line and the bit line in accordance with input data, and writing data in the memory cell, the control circuit carrying out write using k value (k<=n) in the write operation, charging the bit line, and thereafter, changing the word line potential m times to verify whether or not the memory cell reaches a normal m threshold value (m<=k), charging the bit line in j value (j<=n) data read, and thereafter, changing a voltage supplied to the word line m times same as the verify operation to carry out a read operation.

According to a sixth aspect of the present invention, there is provided a semiconductor memory device comprising: a memory cell array having several memory cells arrayed like a matrix, which are connected to a word line and a bit line and store n value (n: natural number more than 3); and a control circuit controlling each potential of the word line and the bit line in accordance with input data, and writing data in the memory cell, the control circuit carrying out write using k value (k<=n) in the write operation, and charging the bit line, thereafter, changing the word line potential m times to verify whether or not the memory cell reaches a normal m threshold value (m<=k), charging the bit line again, thereafter, changing the word line potential m times to verify whether or not the memory cell reaches a normal m threshold value (m<=k), and in the next write operation, making a write speed late when the memory cell reaches the normal m threshold value while carrying out no write operation when it reaches the normal m threshold value.

According to a seventh aspect of the present invention, there is provided a semiconductor memory device comprising: a memory cell array storing n value (n: natural number more than 2), and having at least one first memory cell arrayed like matrix and at least one second memory cell selected simultaneously with the first memory cell, the memory cell array outputting data of the first memory cell when a logic level of the second memory cell is a first logic level, and outputting output data of the first memory cell as a fixed value when the logic level of the second memory cell is a second logic level.

BRIEF DESCRIPTION OF THE SEVERAL VIEWS OF THE DRAWING

FIG. 11A, FIG. 11B and FIG. 11C are views showing the relationship between data stored in a data cache and write cells;

FIG. 16 is a view showing the content of data cache in the program operation shown in FIG. 15;

FIG. 18 is a circuit diagram showing the configuration of a data storage circuit applied to a fourth embodiment;

DETAILED DESCRIPTION OF THE INVENTION

Embodiments of the present invention will be described below with reference to the accompanying drawings.

(First Embodiment)

The principle of the first embodiment will be explained below.

Figure 1A:
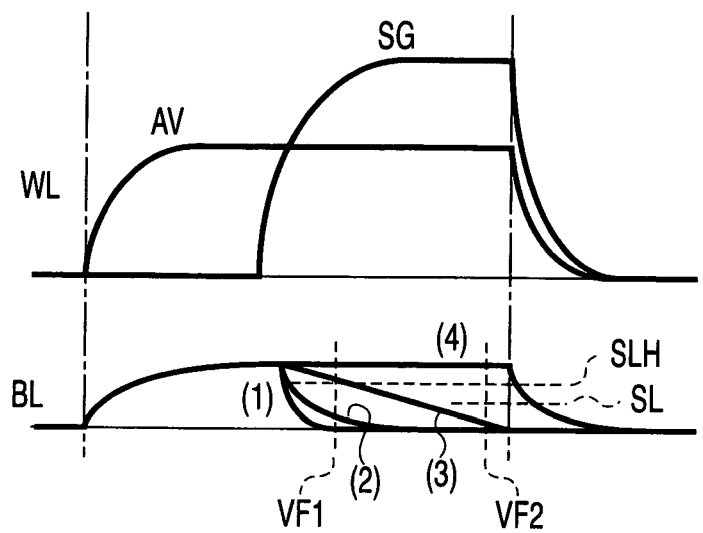
FIG. 1A is a waveform chart showing word line and bit line potentials according to a first embodiment.
Figure 1B:
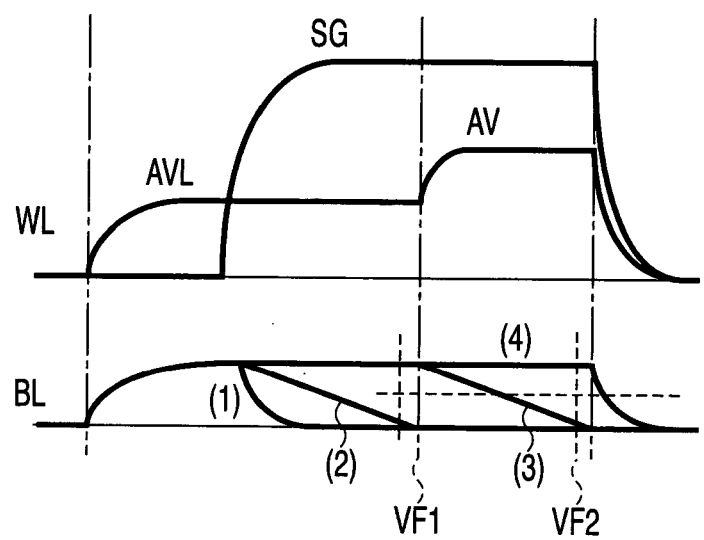
FIG. 1B is a waveform chart showing a program verify operation of changing a word line potential.
Figure 2:
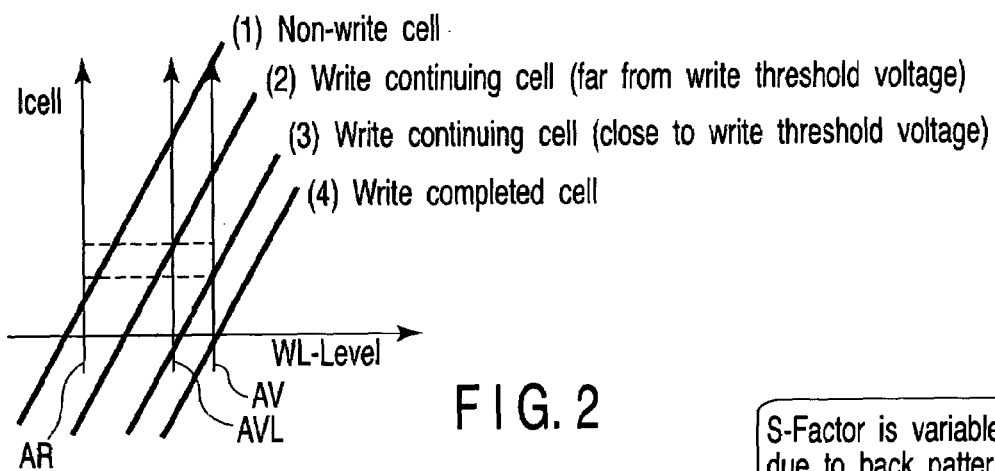
FIG. 2 corresponds to FIG. 1A, and is a view showing Vg-Id (gate voltage-drain current) characteristic of cell.

FIG. 1A shows word line and bit line potentials in the first embodiment, and FIG. 2 shows Vg-Id (gate voltage-drain current) characteristic of each cell. As shown in FIG. 1A, according to the first embodiment, the word line potential is set to a normal write verify level (AV), and then, the difference of discharge speed of the bit line is detected, thereby carrying out a first time verify. Thereafter, a normal verify operation, that is, second time verify operation is carried out without changing the word line potential. On the contrary, FIG. 1B shows a program verify operation of changing the word line potential.

As illustrated in FIG. 1A, the bit line is charged while the potential of a word line WL is set to a normal verify level (AV). Thereafter, a select gate is set high and a pre-charged bit lone BL is discharged. In a non-write cell (shown by (1) in FIG. 1A) and a write continuing cell (shown by (2) in FIG. 1A), which is far from a write threshold voltage, the bit line potential becomes low because current is carried. On the other hand, in a write continuing cell (shown by (3) in FIG. 1A), which is close to the write threshold voltage and a write completed cell (shown by (4) in FIG. 1A), the bit line potential is intactly kept high. At that time, the bit line potential is detected (first time verify VF1). In this case, the bit line potential is detected using a detection level SLH higher than a normal bit line potential.

The discharge of the bit line is continued, and thereby, the bit line potential becomes low in the write continuing cell (shown by (3) in FIG. 1A). Therefore, the bit line potential becomes low in only write completed cell (shown by (4) in FIG. 1A). At that time, the bit line potential is detected (second time verify VF2). The detection level is a normal detection level SL.

According to the result of the second time verify, a cell becoming high is a write completed cell, likewise the foregoing QPW. Thus, in the next program loop, the write completed cell is regarded as a non-write cell, and then, the bit line is supplied with power supply voltage Vdd not to carry out a write operation. A write incomplete cell according to the result of the second time verify carries out a write operation in the next program loop. However, if the write incomplete cell is a cell becoming high according to the result of the first time verify, the bit line is supplied with an intermediate voltage (e.g., 0.75V) to carry out a write operation at a reduced write speed. Moreover, if the cell is a cell becoming low according to the result of the first time verify, the bit line is supplied with a ground voltage Vss to carry out a write operation.

In the manner as described above, program and verify are repeated until all write cells pass the second time verify. Therefore, the write speed of the cells closing to a normal verify potential becomes late; as a result, threshold voltage distribution is narrowed.

According to the first embodiment, there is no need of changing the word line potential in the program verify operation; therefore, high-speed write is provided.

Figure 1C:
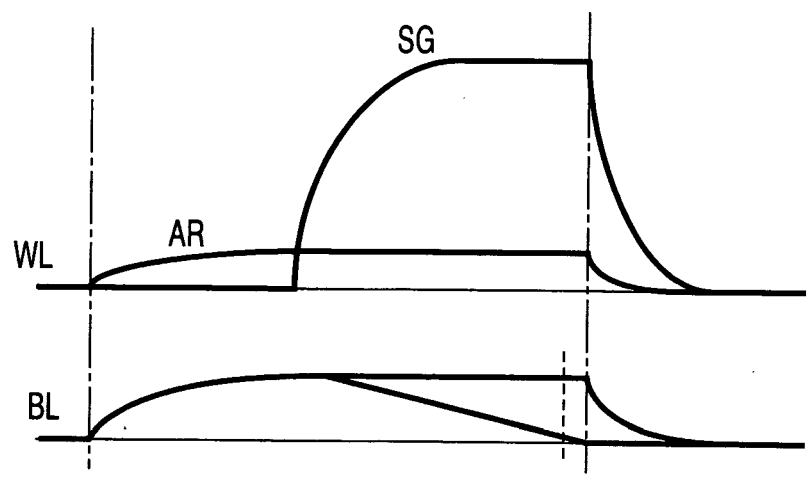
FIG. 1C is a waveform chart showing each potential of word line WL and bit line BL in a read operation.

FIG. 1C shows each waveform of word line WL, bit line BL and select gate SG in a read operation. As is evident from FIG. 1C, a normal verify read operation and the read operation become the same operation excluding word line potential. In other words, the bit line discharge time becomes equal in the foregoing normal verify read operation and read operation; therefore, the displacement of threshold voltage is reduced. Thus, data written in the memory cell is securely read. Therefore, this serves to reduce a margin between the normal verify read operation and the read operation.

Figure 3A:
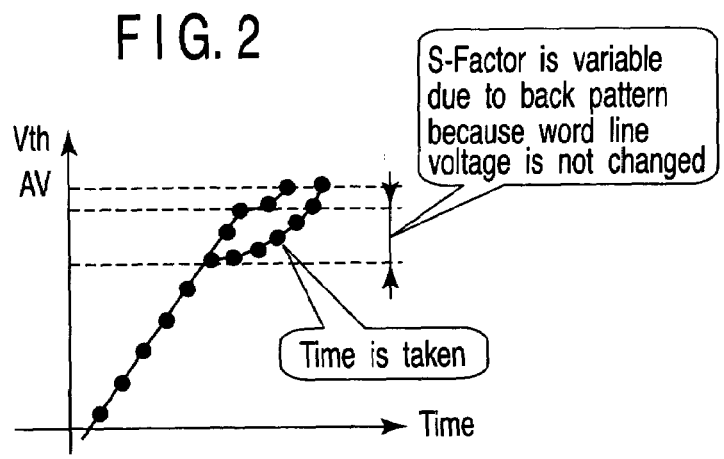
FIG. 3A is a view showing program step count and a change of threshold voltage in the first embodiment.
Figure 3B:
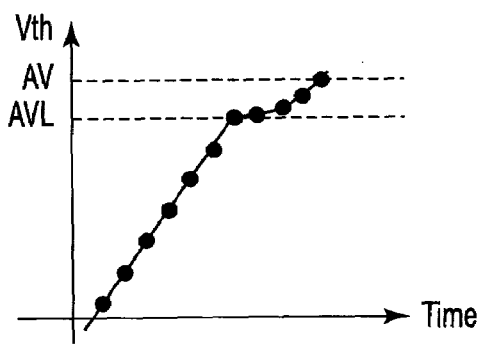
FIG. 3B is a view showing program step count and a change of threshold voltage in QPW.

FIG. 3A shows program step count and a change of threshold voltage in the first embodiment. FIG. 3B shows program step count and a change of threshold voltage in QPW. In the case shown in FIG. 3B, if threshold voltage exceeds a verify level (AVL) lower than a normal verify level (AV), the bit line is supplied with an intermediate potential (e.g., 0.75V) to reduce a write speed in the next write operation.

On the other hand, in the first embodiment shown in FIG. 3A, if the threshold voltage is lower than a normal verify level (AV), the threshold voltage of memory cell is detected at a cell current discharge speed without changing the word line level. For this reason, S-factor (cell current to word line potential) is variable due to back pattern (characteristic changes resulting from other cell write to NAND cell). Therefore, detection level is not uniform, and a write speed is reduced.

Figure 3C:
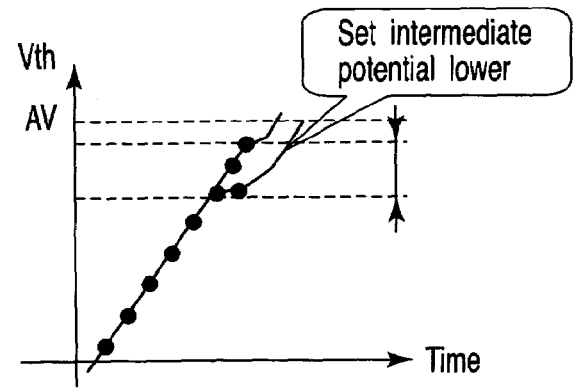
FIG. 3C is a view showing a modification example of FIG. 3A.

In this case, as depicted in FIG. 3C, the intermediate potential supplied to the bit line is set to an intermediate voltage (e.g., 0.4V) lower than a normal case to slightly enhance the write speed.

The first embodiment will be explained in detail.

Figure 4:
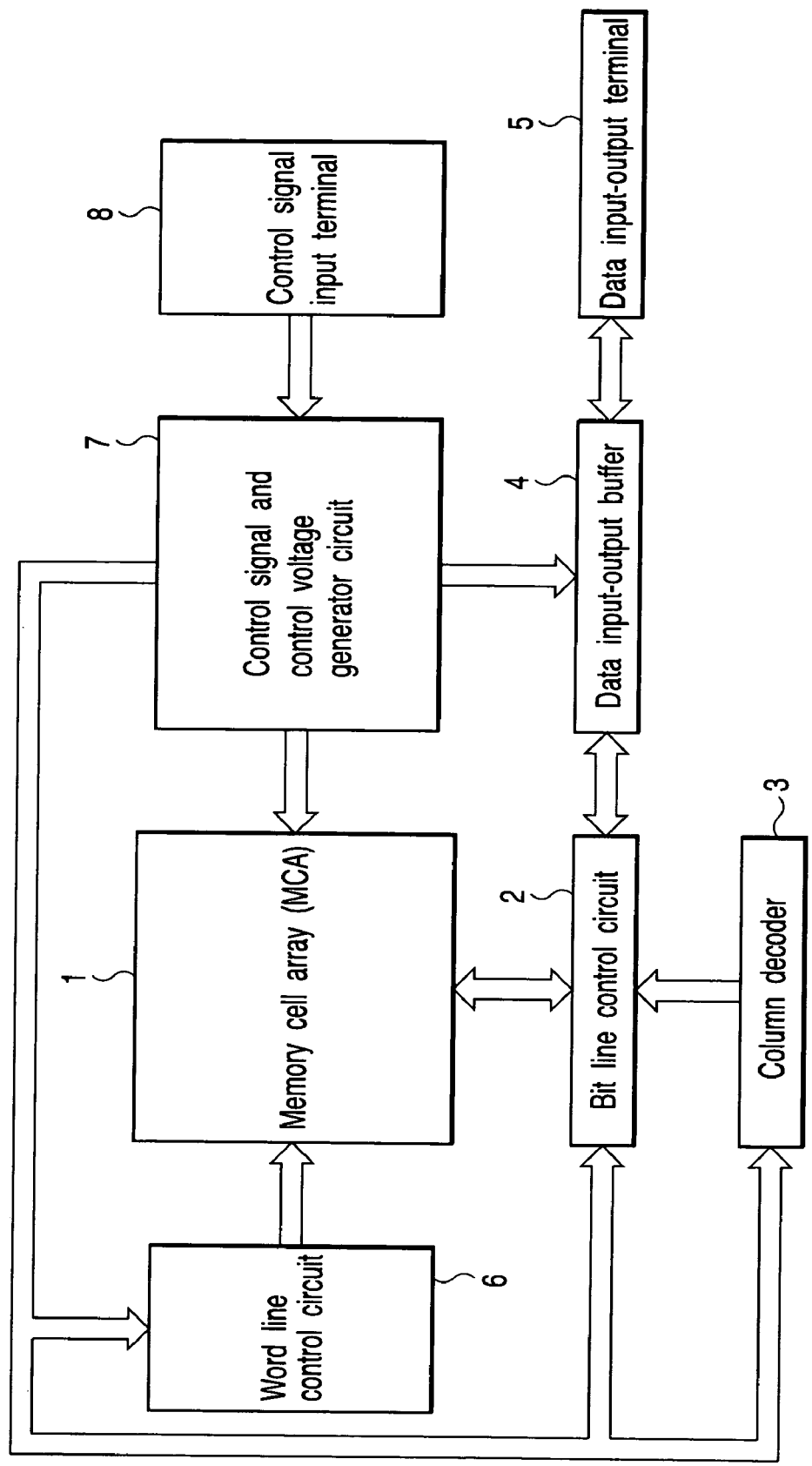
FIG. 4 is a block diagram showing the configuration of a semiconductor memory device according to a first embodiment.

FIG. 4 shows the configuration of a semiconductor memory device according to a first embodiment, that is, NAND flash memory storing binary data.

A memory cell array 1 comprises a plurality of electrically data rewritable memory cells, which are arrayed like a matrix. The memory cells each includes several bit lines, several word lines and shared source line, and comprises an EEPROM cell. The memory cell array 1 is connected with bit line control circuit 2 for controlling bit lines and word line control circuit 6.

The bit line control circuit 2 includes several data storage circuits and flag data storage circuits described later. The bit line control circuit 2 carries out the following operations. Specifically, the control circuit 2 reads data of a memory cell of the memory cell array 1 via the bit line. The control circuit 2 detects a state of the memory cell of the memory cell array 1 via the bit line. The control circuit 2 applies a write control voltage to the memory cell of the memory cell array 1 via the bit line to make write to the memory cell. Moreover, the bit line control circuit 2 is connected with column decoder 3, data input-output buffer 4. The column decoder 3 selects a data storage circuit of the bit line control circuit 2. Memory cell data read to the data storage circuit is externally output from a data input-output terminal 5 via the data input-output buffer 4.

Write data input to the data input-output terminal 5 from the outside is input to the data storage circuit selected by the column decoder 3 via the data input-output buffer 4.

The word line control circuit 6 is connected to the memory cell array 1. The word line control circuit 6 selects a word line of the memory cell array 1, and applies a voltage required for read, write or erase to the selected word line.

The foregoing memory cell array 1, bit line control circuit 2, column decoder 3, data input-output buffer 4 and word line control circuit 6 are connected to a control signal and control voltage generator circuit 7. The control signal and control voltage generator circuit 7 controls the foregoing components. The control signal and control voltage generator circuit 7 is connected to a control signal input terminal 8, and controlled according a control signal inputted via the terminal 8 from the outside.

The foregoing bit line control circuit 2, column decoder 3, word line control circuit 6 and control signal and control voltage generator circuit 7 form write circuit and read circuit.

Figure 5:
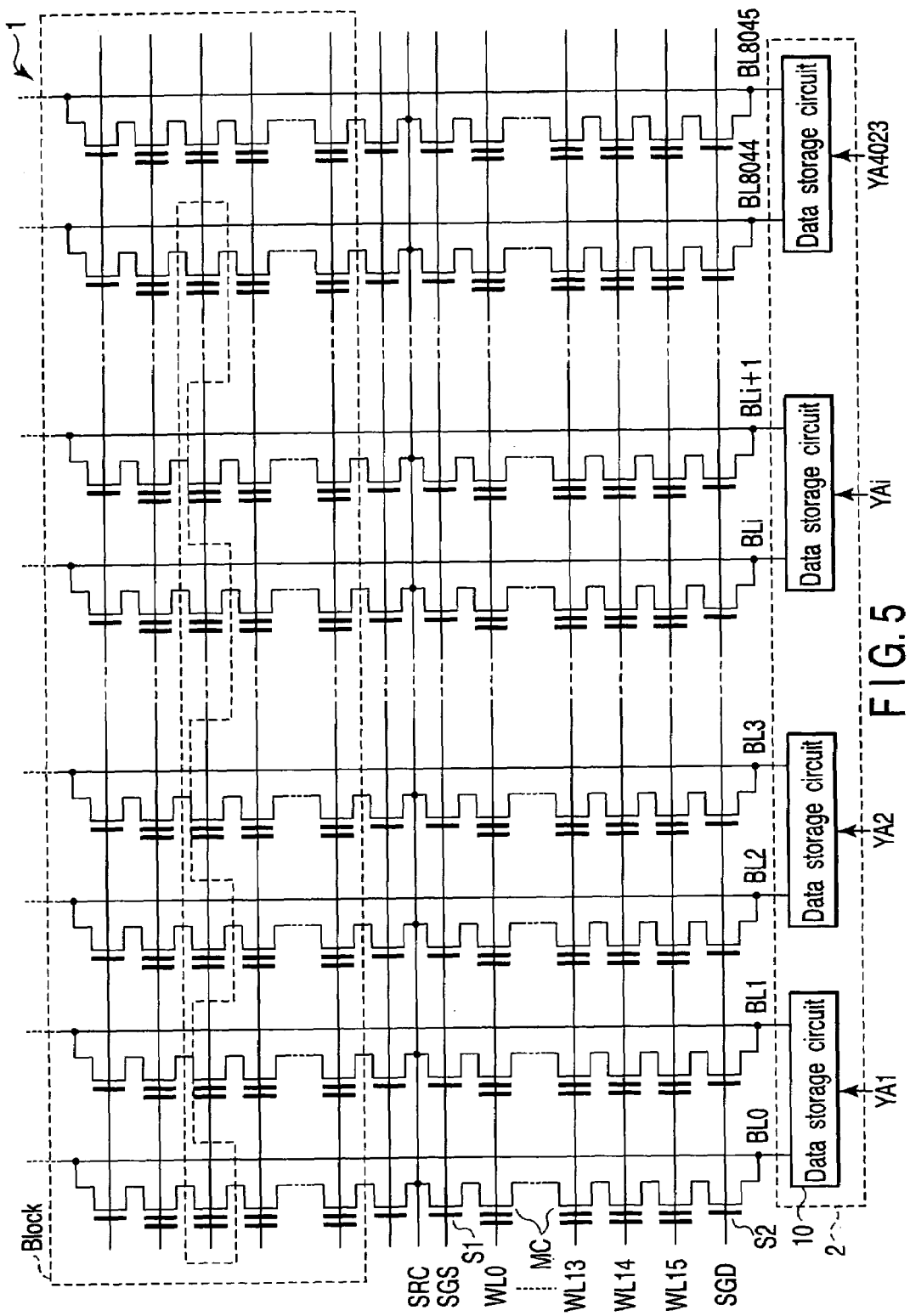
FIG. 5 is a circuit diagram showing each configuration of a memory cell array 1 and a bit line control circuit 2 shown in FIG. 4.

FIG. 5 shows each configuration of the memory cell array 1 and the bit line control circuit 2 shown in FIG. 4. Several NAND cells are arrayed in the memory cell array 1. One NAND cell is composed of serial-connected 16 memory cells MC each comprising EEPROM, select gates S1 and S2. The select gate S2 is connected to a bit line BL0; on the other hand, the select gate S1 is connected to a source line SRC. The control gate of each row-arrayed memory cell MC is connected in common to word lines WL0 to WL13, WL14 and WL15. The select gate S2 is connected in common to a select line SGD; on the other hand, the select gate S1 is connected in common to a select line SGS.

The bit line control circuit 2 has several data storage circuits 10. The data storage circuits 10 are respectively connected with a pair of bit lines (BL0, BL1), (BL2, BL3) . . . (BLi, BLi+1) and (BL8044, BL8045).

The memory cell array 1 includes several blocks shown by the broken line. Each block is composed of several NAND cells, and data is erased at a unit of block. The erase operation is simultaneously carried out with respect to two bit lines connected to the data storage circuit 10.

Several memory cells (surrounded by the broken line), which are arrayed on every other bit line and connected to one word line, form one sector. Data is written and read every sector.

One of two bit lines (BLi, BLi+1) connected t the data storage circuit 10 is selected in read operation, program verify operation and program operation. In this case, one bit line is selected in accordance with externally supplied address signals (YA1, YA2 . . . YAi . . . YA4023). Moreover, one word line is selected in accordance with an external address.

Figure 6A:
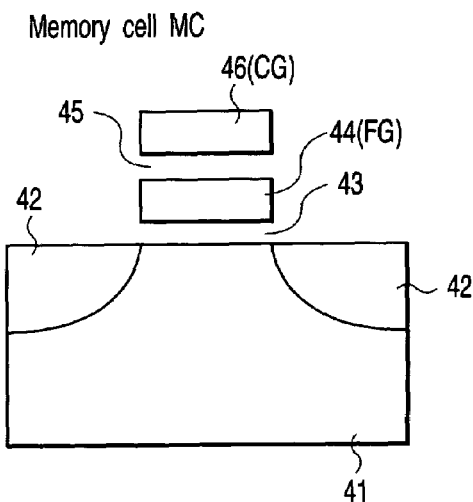
FIG. 6A and FIG. 6B are cross-sectional views showing each structure of memory cell and select transistor.
Figure 6B:
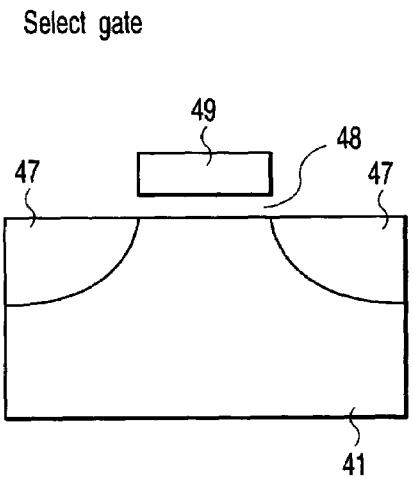
Figure 7:
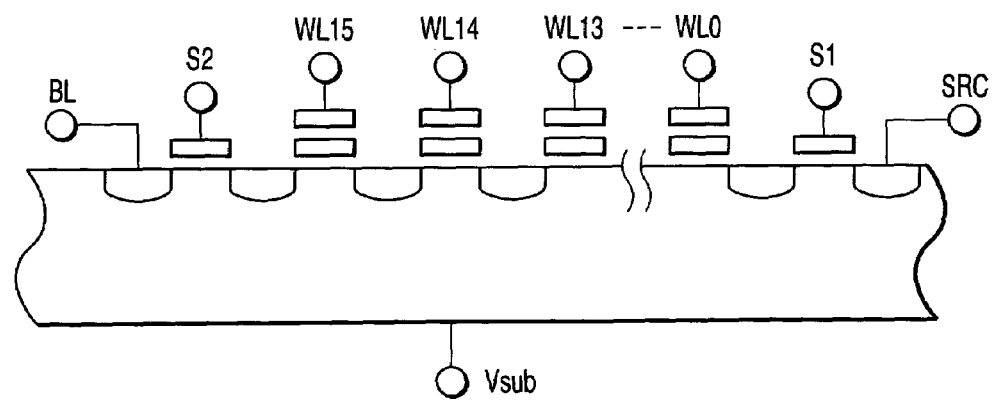
FIG. 7 is a cross-section view showing the structure of one NAND cell of the memory cell array.

FIGS. 6A, 6B and FIG. 7 are cross-sectional views showing each structure of memory cell and select transistor.

FIG. 6A and FIG. 6B are cross-sectional views showing each structure of memory cell and select transistor. FIG. 6A shows a memory cell. A substrate 41 is formed with an n-type diffusion layer 42 as a source/drain of the memory cell. A floating gate (FG) 44 is formed above the substrate 41 via a gate insulating film 43. A control gate (CG) 46 is formed above the floating gate 44 via an insulating film 45. FIG. 6B shows a select gate. A substrate 41 is formed with an n-type diffusion layer 47 as a source/drain. A control gate 49 is formed above the substrate 41 via a gate insulating film 48.

FIG. 7 shows the cross-section of one NAND cell of the memory cell array. As shown in FIG. 7, one NAND cell has 16 memory cells having the structure shown in FIG. 6A, which are serial-connected. The source/drain side of the NAND cell is provided with select gates S1 and S2 having the structure shown in FIG. 6B.

Figure 8:
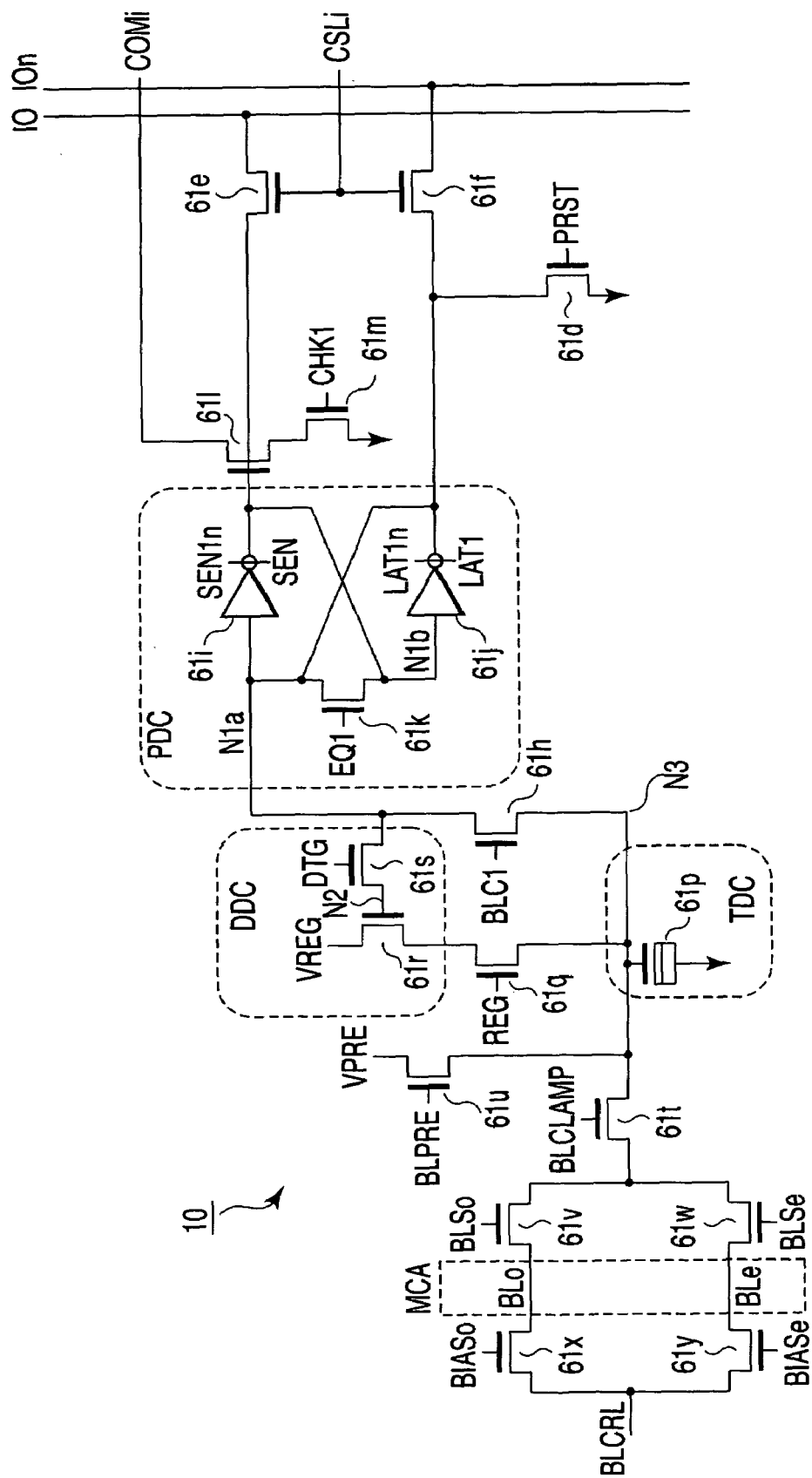
FIG. 8 is a circuit diagram showing the configuration of a data storage circuit shown in FIG. 5.

FIG. 8 is a circuit diagram showing the configuration of the data storage circuit 10 shown in FIG. 5.

The data storage circuit 10 has primary data cache (PDC), dynamic data cache (DDC) and temporary data cache (TDC). The foregoing PDC and DDC hold input data in a write operation, hold read data in a read operation, temporarily hold data in a verify operation, and are used to operate internal data when storing multi-valued data. The TDC amplifies bit line data in a data read operation while temporarily holds it, and is used to operate internal data when storing multi-valued data.

An input-output data line IO is connected to a node N1*b* of the PDC via a column select transistor 61*e*. An input-output data line IOn is connected to a node N1*a* of the PDC via a column select transistor 61*f*. Each gate of these transistors 61*e* and 61*f* is supplied with a column select signal CSLi. A transistor 61*d* is connected between the node N1*a* and ground. The gate of the transistor 61*d* is supplied with a signal PRST.

The PDC is composed of clocked inverter circuits 61*i*, 61*j* and transistor 61*k*. The transistor 61*k* is connected between imputer terminals of clocked inverter circuits 61*i* and 61*j*. The gate of the transistor 61*k* is supplied with a signal EQ1. The node N1*b* of the PDC is connected to the gate of a transistor 61*l*. One terminal of the current path of the transistor 61*l* is grounded via a transistor 61*m*. The gate of the transistor 61*m* is supplied with a signal CHK1. The other terminal of the current path of the transistor 61*m* is supplied with a signal COMi. The signal COMi is a signal, which is common to all data storage circuits 10 and show whether the verify operation of all data storage circuits 10 is completed. Specifically, when the verify operation is completed, the node N1b of the PDC becomes low, as described later. In this state, when the signal CHK1 is set high, the signal COMi becomes high if the verify operation is completed.

The node N1a is further connected to a node N3 via a transistor 61h. The gate of the transistor 61h is supplied with a signal BLC1. The foregoing TDC is connected between the node N3 and a ground. The TDC comprises a MOS capacitor 61p, for example. The node N3 is connected with the DDC via a transistor 61q. The gate of the transistor 61q is supplied with a signal REG.

The DDC is composed of transistors 61r and 61s. One terminal of the current path of the transistor 61r is supplied with a signal VREG while the other terminal thereof is connected to the current path of the transistor 61q. The gate of the transistor 61r is connected to the node N1a of the PDC via the transistor 61s. The gate of the transistor 61s is supplied with a signal DTG.

The N3 is connected with one terminal of each current path of transistors 61t and 61u. The other terminal of the current path of the transistor 61u is supplied with a signal VPRE while the gate thereof is supplied with a signal BLPRE. The gate of transistor 61t is supplied with a signal BLCLAMP. The other terminal of the current path of the transistor 61t is connected to one end of a bit line BLo via a transistor 61v while one terminal thereof is connected to one end of a bit line BLe via a transistor 61w. The other end of the bit line BLo is connected to one terminal of the current path of a transistor 61x. The gate of the transistor 61x is supplied with a signal BlASo. The other end of the bit line BLe is connected to one terminal of the current path of a transistor 61y. The gate of the transistor 61y is supplied with a signal BlASe. The other terminal of each current path of these transistors 61x and 61y is supplied with a signal BLCRL. The transistors 61x and 61y are complementarily powered on in accordance with signals BlASo, BlASe to supply a potential of the signal BLCRL to a non-select bit line.

The foregoing signal and voltage are generated from the control signal and control voltage generator circuit 7 shown in FIG. 4. The following operation is controlled based on control of the control signal and control voltage generator circuit 7.

The present memory is a binary memory, and capable of storing 1-bit data in one cell, for example.

Figure 9:
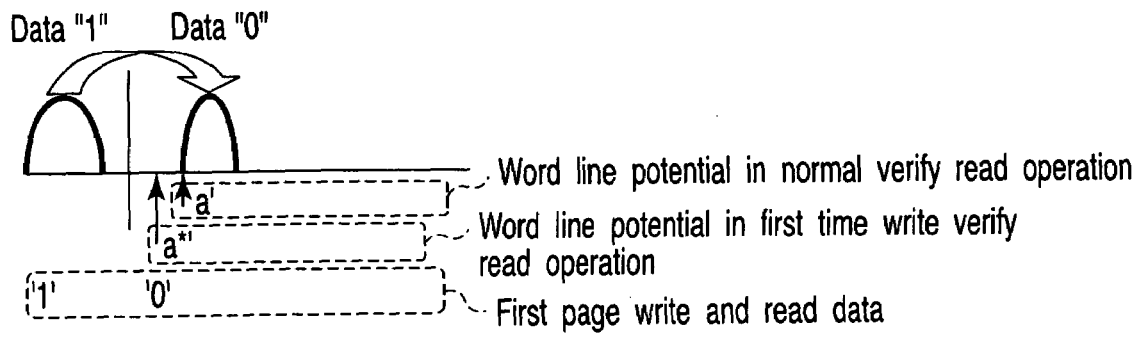
FIG. 9 is a view to explain the relationship between data and threshold voltage in a memory cell according to the first embodiment.

FIG. 9 shows the relationship between data and threshold voltage in memory cell. When the memory carries out an erase operation, the threshold voltage of the memory cell becomes negative, and then, write and read data become "1". The threshold voltage is stepped up from the preceding state according to a write operation, and thereby, write and read data become "0".

(Program and Program Verify)

Figure 10:
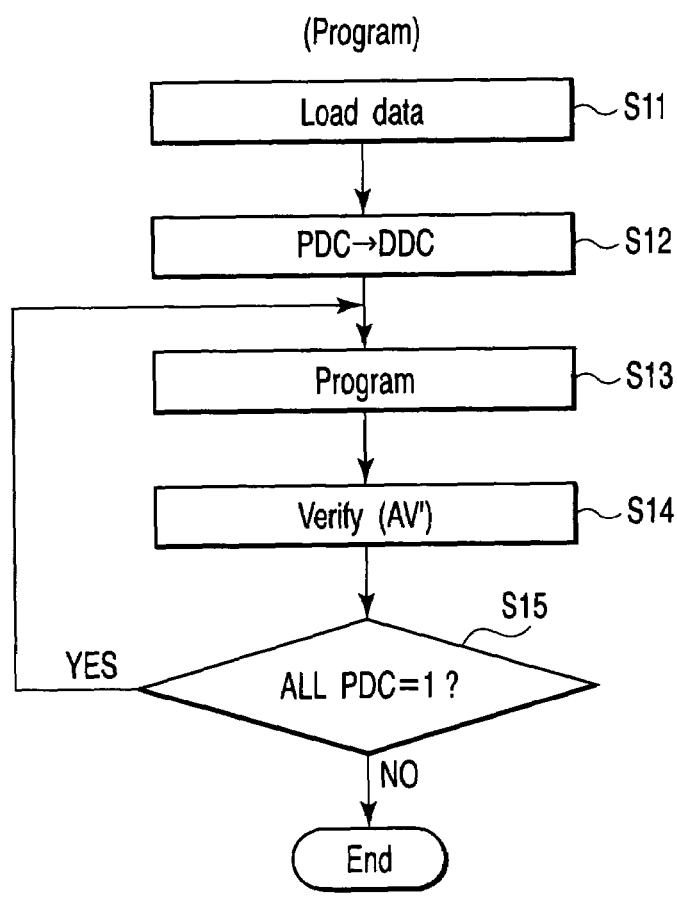
FIG. 10 is a flowchart to explain a first page program operation.

FIG. 10 shows a first page program operation. The program operation will be explained below with reference to FIG. 10 and FIG. 8.

(Data Read) (S11)

According to the program operation, an address is fist designated to select one sector shown in FIG. 5. Data to be written is input from the outside, and stored in each PDC of all data storage circuits 10. If data "1" (do not carry out) is supplied from the outside, the node N1a of the PDC becomes high. On the other hand, if data "0" (carry out write) is supplied, the node N1a of the PDC becomes low. In the following description, PDC data is given as a potential of the node N1a; on the other hand, DDC data is given as a potential of the node N2.

(Setting of Data Cache) (S12)

When a write command is supplied, the signal DTG instantaneously becomes high, and then, PDC data is copied into the DDC.

(Program) (S13)

When the potential of the signal BLC is set to Vdd+Vth (Vth: threshold voltage of N channel MOS transistor), the bit line becomes power supply voltage Vdd if data "1" (do not carry out write) is stored in the PDC. If data "0" (carry out write) is stored therein, the bit line becomes ground potential Vss. Write must not be carried out with respect to cells connected to the selected word line and having non-select page, that is, non-select bit line. Thus, bit lines connected to these cells are set to voltage Vdd. Here, the select line SG1 of the selected block is set to Vdd, and Vpgm (e.g., 20V) is supplied to a select word line while Vpass (e.g., 10V) is supplied to a non-select word line. In this case, the channel of the cell becomes voltage Vss, and the word line becomes voltage Vpgm; therefore, write is carried out. On the other hand, if the bit line becomes Vdd, the channel of the cell steps up Vpgm, and not Vss; therefore, it becomes Vpgm/2 in coupling. For this reason, program is not executed.

The signal BLC is set low while the signal REG is set to an intermediate potential (e.g., 0.75+Vth), and thereby, the bit line becomes the intermediate potential only when PDC is low while DDC is high. Thus, the write speed becomes later than normal write; as a result, write is slightly carried out. On the other hand, if PDC is L level while DDC is low, the potential of the bit line is kept at Vss. Thus, write is normally carried out. Moreover, if PDC is high, write is not carried out. In a first time program operation (before a verify operation is made), PDC=DDC is given. Therefore, the bit line does not become an intermediate potential. As depicted in FIG. 9, if data "0" is written in the memory cell, memory cell data is set to "1". If data "1" is written in the memory cell, memory cell data is set to "0" as it is unchanged.

(Program Verify) (S14)

According to a program verify operation, a select word line of the selected block is supplied with verify potential AV (e.g., 0.8V) high than read potential AR (e.g., 0V or 0.2V). Non-select word line and select line SG1 are supplied with Vread. Simultaneously, the bit line is pre-charged under condition that signal VPRE=Vdd, signal BLPRE=Vdd, signal BLCLAMP=Vpre+Vth (e.g., 0.7V+Vth).

The source-side select line SGS of the cell is set high. As shown in FIG. 1a and FIG. 2, in non-write cell (1) and write continuing cell (2) far from write threshold voltage, the bit line potential becomes low because current is carried. However, in write continuing cell (3) close to write threshold voltage, the cell current is a little; for this reason, the bit line potential merely slightly steps down. In the write completed cell (4), the bit line potential is kept high.

In the data storage circuit 10, signal VPRE=Vdd and signal BLPRE=Vdd+Vth are given to pre-charge the TDC to Vdd. Thereafter, when signal BLCLAMP Vsen0+Vth (e.g., 0.65V+Vth) is given, TDC becomes high if the bit line potential is higher than 0.65V. On the other hand, TDC becomes low if the bit line potential is lower than 0.65V. In other words, the TDC becomes low in the cases (1) and (2); on the other hand, it becomes high in the cases (3) and (4) (first time verify VF1).

The bit line detection potential Vsen0 may be set to a level higher than a normal bit line detection potential Vsen (e.g., 0.45V) or to the potential same as that.

When signal VPRE=Vdd and signal REG=Vdd are given, if DDC=high, that is, it becomes high in write non-select or the first time program verify, TDC forcedly becomes high.

Thereafter, signal DTG=Vdd+Vth is given to copy PDC data into DDC. Thereafter, signal BLC=Vdd+Vth is given to capture the potential of the TDC in the PDC. PDC=high is given in write non-select cell or cells (3) and (4). On the other hand, PDC=low is given in cells (1) and (2).

The discharge of the bit line is continued, and thereby, bit line of the write continuing cell (3) is discharged; therefore, it becomes low. As a result, the potential of the bit line becomes high in the write completed cell only.

In the data storage circuit, signal VPRE=Vdd and signal BLPRE=Vdd+Vth are given to pre-charge the TDC to Vdd. Thereafter, signal BLCLAMP is set to Vsen+Vth (e.g., 0.45V+Vth). If the bit line potential is higher than 0.45V, the TDC becomes high. On the other hand, if the bit line potential is lower than 0.45V, the TDC becomes low. In other words, the TDC becomes low in the cases (cells) (1), (2) and (3), and becomes high in the case (cell (4) (second time verify VF2).

Moreover, when signal VPRE=Vdd and signal REG=Vdd are given, if DDC=high, that is, it becomes high in write non-select or the second time program verify (program is completed), TDC forcedly becomes high. Thereafter, signal DTG=Vdd+Vth is given to copy PDC data into DDC. Thereafter, signal BLC=Vdd+Vth is given to capture the potential of the TDC in the PDC. PDC=high is given in write non-select cell or write completed cell. On the other hand, PDC=low is given in write incomplete cell.

FIG. 11A, FIG. 11B and FIG. 11C show the relationship between data stored in data cache and write cell.

Thereafter, program and verify operations are repeated until data of each PDC of all data storage circuits becomes high. If DDC is high during the program operation, the bit line is supplied with an intermediate potential to make write speed late, and thereby, the threshold voltage distribution width of cell is reduced.

(Read)

According to a read operation, a read potential AR (e.g., 0V or 0.2V) is supplied to a select word line of the selected block shown in FIG. 5 to supply a voltage Vread to non-select word line and select line SGD. Simultaneously, in the data storage circuit 10 shown in FIG. 8, signal VPRE=Vdd, signal BLPRE=Vdd and signal BLCLAMP=Vpre+Vth (e.g., 0.7V+Vth) are given to pre-charge the bit line.

The source-side select line SGS of the cell is set high.

FIG. 1C shows each potential of word line WL and bit line BL in a read operation. In the read operation, it is possible to carry out the second time verify only made in the program verify operation. However, the same operation as the program verify operation is carried out, thereby reducing margin between the program verify operation and the read operation. Thus, in the data storage circuit 10, signal VPRE=Vdd and signal BLPRE=Vdd+Vth are given to pre-charge the TDC to Vdd, like the program verify operation. Thereafter, signal BLCLAMP=Vpre+Vth (e.g., 0.7V+Vth) is given, and then, the discharge of the bit line is continued. Thereafter, in the data storage circuit, signal VPRE=Vdd, signal BLPRE=Vdd+Vth are again given to pre-charge the TDC to Vdd. By doing so, signal BLCLAMP=Vsen+Vth e.g., 0.45V+Vth) is given. If the bit line potential is higher than 0.45V, TDC=high is obtained. If the bit line potential is lower than 0.45V, TDC=low is obtained. Thereafter, signal BLC=Vdd+Vth is given to capture the TDC potential in the PDC. As seen from FIG. 9, if write and read cell data are "1", PDC=low is given; on the other hand, if the data is "1", PDC=high is given. However, these data are inverted, and thereafter, output outside.

(Erase)

According to an erase operation, erase is carried out every one block shown in FIG. 5. When erase is carried out, write and read cell data becomes "1" as shown in FIG. 9.

(Modification Example of First Embodiment)

(Change of First Time Verify Detection Potential (Vsen0) or Detection Timing)

Figure 12:
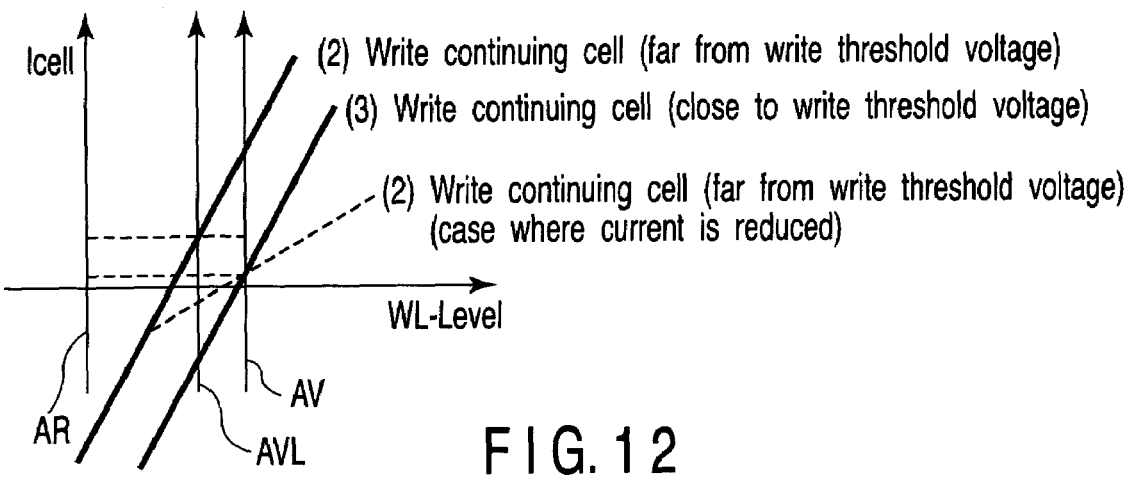
FIG. 12 shows a modification example, and is a view showing Vg-Id characteristic.

Program and erase operations are repeated, and thereby, current flowing through the cell is reduced, and the gradient of Vg-Id characteristic becomes small as shown by (2) in FIG. 12. For this reason, in a write continuing cell (2) far from threshold voltage, the case where the PDC becomes high in the first time verify increases. When the PDC becomes high, an intermediate potential is supplied in the next program; for this reason, the write speed becomes late. As a result, the following problem arises. Specifically, the cell does not readily reach a normal (predetermined) threshold voltage; for this reason, the program verify loop count increases until it reaches the normal threshold voltage.

In view of the foregoing circumstances, the control signal and control voltage generator circuit 7 shown in FIG. 4 is provided with a counter. The counter counts loop every several page or block writes. If the counted number of loops is more than a preset value, the level of Vsen0 is increased, or the first time verify timing is slightly delayed. By doing so, the PDC is controlled to be hard to become high.

Figure 13:
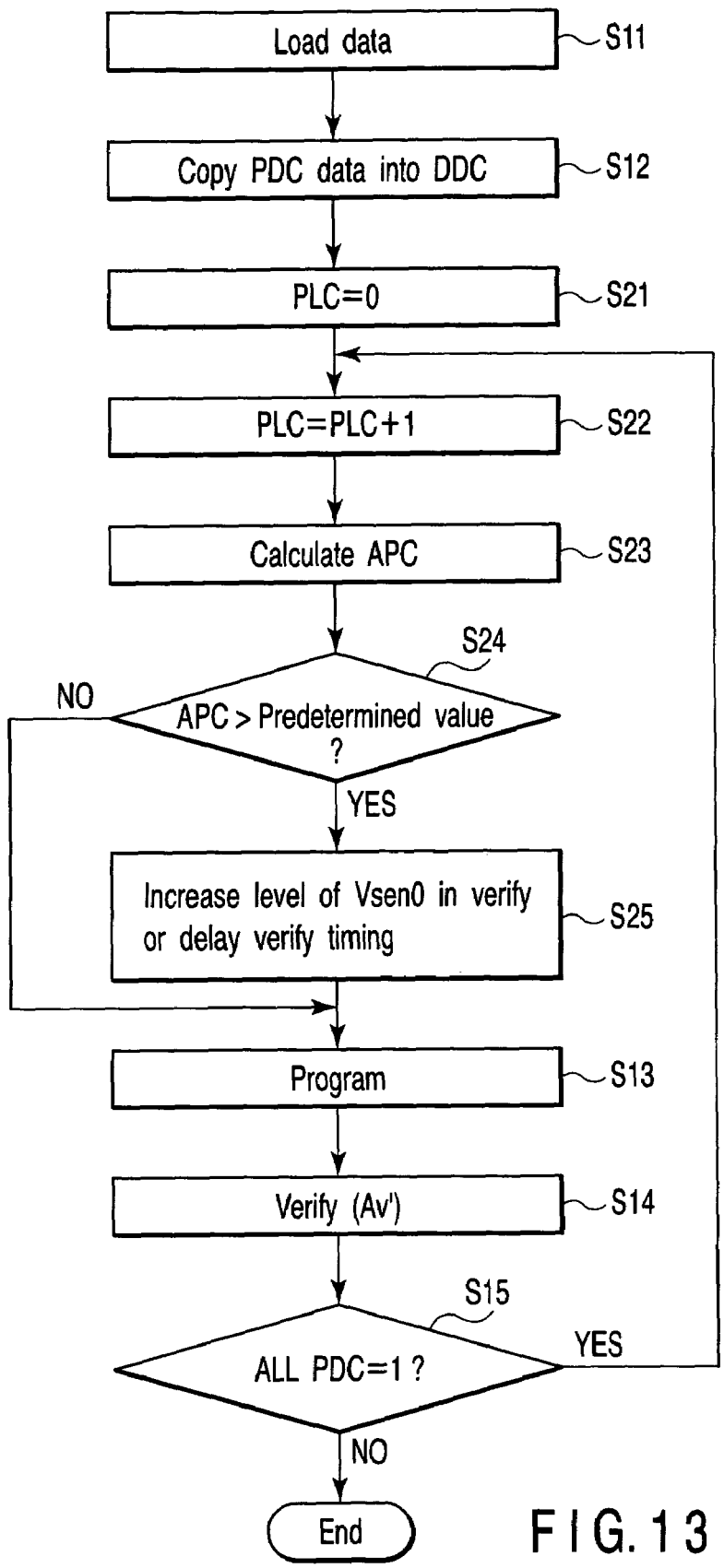
FIG. 13 is a flowchart to explain an operation according to a modification example of the first embodiment.

FIG. 13 is a flowchart to explain a program verify operation. In FIG. 13, the same reference numerals are used to designate steps having meaning identical to FIG. 10. As shown in FIG. 13, data is loaded, and then, PDC data is copied into DDC. Thereafter, a program loop counter PLC counts loops PLC1, PLC2 . . . PLCn every several page or several block writes (S21, S22). Here, PLC1 denotes loop count in one-old program, PLC2 denotes loop count in two-old program, and PLC denotes loop count in n-old program. An average value APC of these loops (PLC1+PLC2+. . . +PLCn/n) is calculated (S23). In other words, the count value of eh counter is divided by program counts, and thereby, the average value APC of the loop count is obtained. If the average value APC is more than a predetermined value, the level of Vsen0 in verify is increased, or the first time verify timing is delayed (S24, S25). In order to delay the verify timing, the timing of generating signals VPRE and BLPRE in the data storage circuit 10 may be delayed. The foregoing configuration is provided, and thereby, the program verify count is reduced.

There is another method of reducing the program verify count. Specifically, the control signal and control voltage generator circuit 7 shown in FIG. 4 is provided with a counter, which counts the erase count every block. Moreover, the memory cell array shown in FIG. 5 is provided with several cells, which store the erase count every block. If the erase count stored in the cell is more than a predetermined value, the PDC is controlled to be hard to become high using the same means as described above.

Figure 14:
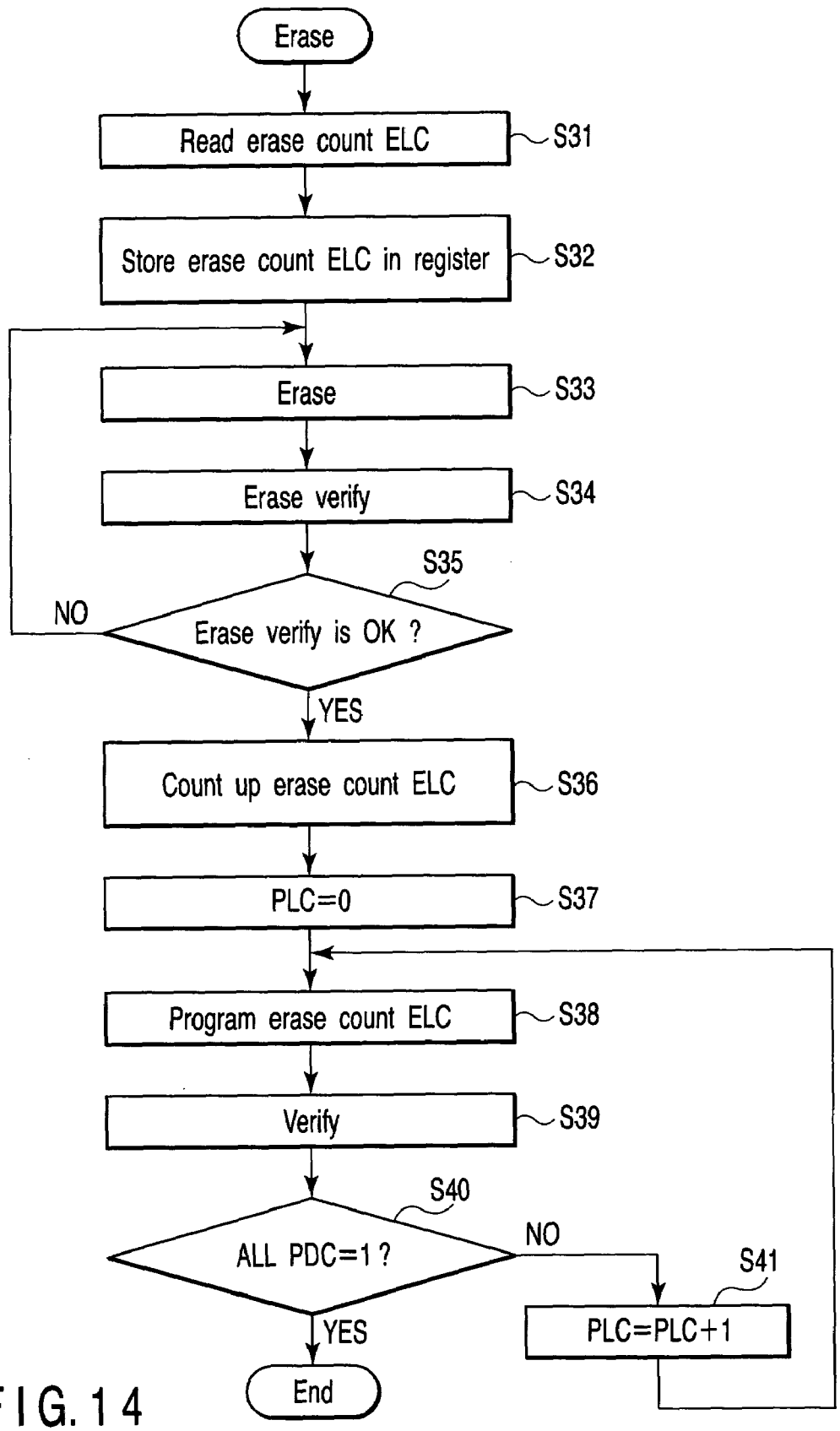
FIG. 14 is a flowchart to explain an erase operation a modification example of the first embodiment.

FIG. 14 is a flowchart to explain an erase operation. When erasing data, an erase count ELC is read from the cell storing the erase count, and then, stored in a register (not shown) (S31, S32). The selected block is erased to verify whether or not erase is sufficient (S33, S34). The foregoing operation is repeated until erase is completed (S35, S33, S34). If erase is completed, the erase count ELC stored in the register is counted up (S36). Then, the counted-up erase count ELC is written in the cell. The write operation is the same as the foregoing program operation. Specifically, the counter PLC counting the program loop count is reset, and then, the erase count ELC is programmed in a predetermined cell (S37, S38). Thereafter, program and verify are repeated until all PDCs becomes "1" (S39, S40, S41, S38). In the manner as described above, the erase count ELC is counted every when the memory cell is erased, and then, stored in the memory cell.

Figure 15:
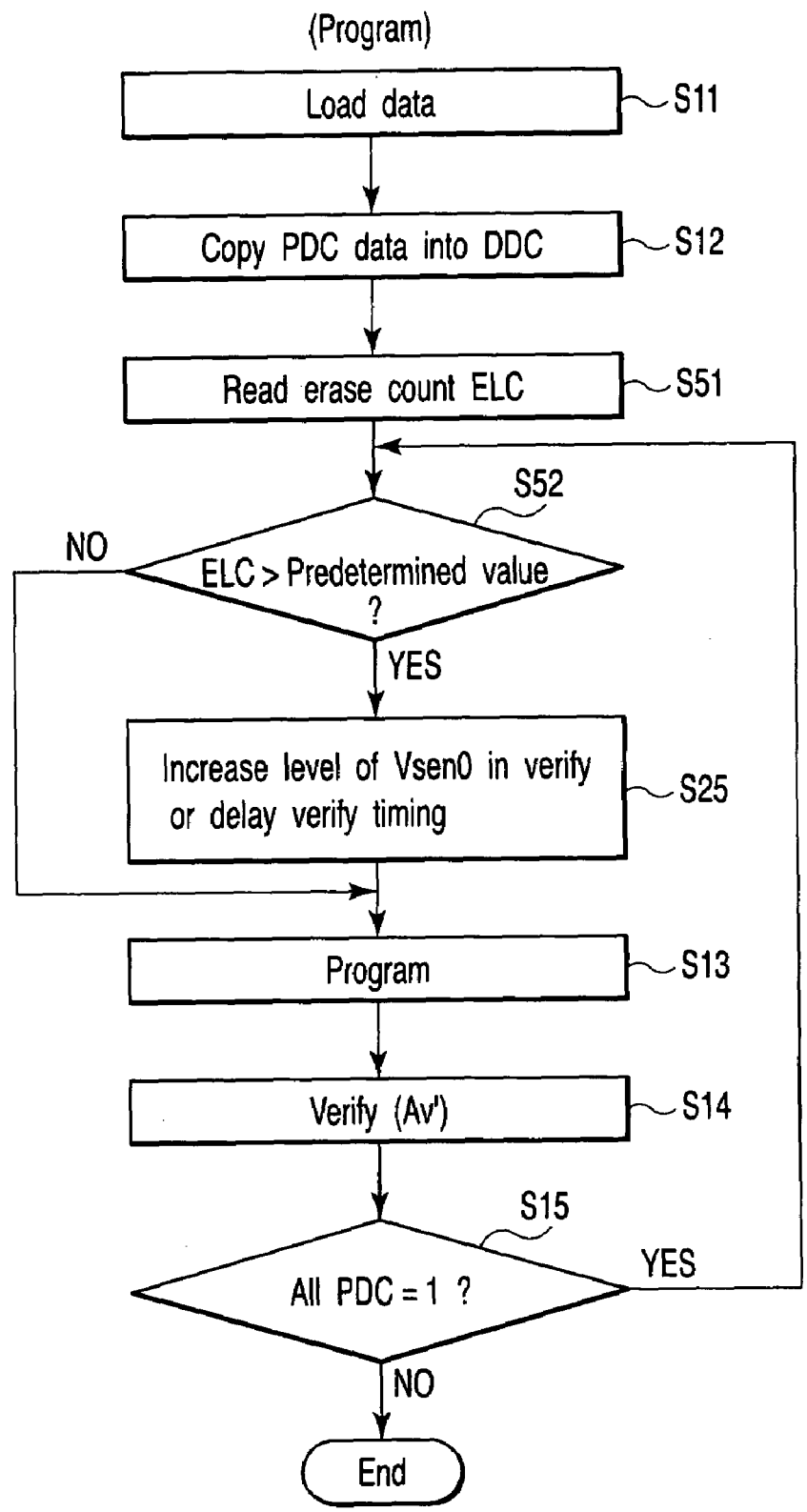
FIG. 15 is a flowchart to explain a program operation a modification example of the first embodiment.

FIG. 15 is a flowchart to explain a program operation. The program of FIG. 15 differs from FIG. 10 in that erase count ELC stored in the memory cell is read before program (S51). If the erase count ELC is more than a predetermined value, a detection potential Vsen0 is increased, or verify timing is delayed (S52, S53).

The foregoing configuration is given, and thereby, program time is shortened in accordance with cell degradation resulting from repetition of program and erase.

The erase count is stored at a unit of block; however, the present invention is not limited to the unit of block. For example, if data is erasable at a unit of page, the erase count may be stored after is counted at a unit of page.

The detection potential Vsen0 or the second time verify timing may be changed regardless of cell degradation resulting from repetition of program and erase. For example, a preset value may be changed every word line or block.

(Second Embodiment)

According to the program verify operation of the first embodiment, the bit line of non-write cell is pre-charged to be discharged. However, if many non-write cells exist, current carrying the source line (SRC) is large. For this reason, the source line becomes a floating state; therefore, the potential of the source line steps up. As a result, current does not readily flow through the write cell to be normally verified. In view of the foregoing circumstances, according to the second embodiment, only bit line to be normally verified is pre-charged.

(Program)

A program operation is the same as the first embodiment. The program operation differs from the first embodiment in that PDC data is inverted during recovery of word line potential.

FIG. 16 shows the relationship between data stored in data cache and write cell. In other words, FIG. 16 shows a state after program recovery and after PDC data is inverted.

(Inversion of PDC Data)

The following operation is carried out in order to invert PDC data. Signal VPRE=Vss and signal BLPRE=Vdd are given to obtain TDC=Vss, and thereafter, signal VREG=Vdd and signal REG=Vdd+Vth are given. If DDC=high, TDC=high is obtained. However, if DDC=low, TDC is kept low. Signal DTG=Vdd+Vth is given to copy PDC data into DDC. Thereafter, signal BLC=Vdd+Vth is given to copy TDC data into PDC. By doing so, the PDC data is moved to DDC; on the other hand, the DDC data is moved to PDC.

Signal VPRE=Vdd and signal BLPRE=Vdd+Vth are given to obtain TDC=Vdd, and thereafter, signal VPRE=Vss and signal REG=Vdd are given. If DDC=high, TDC=low is obtained. However, if DDC=low, TDC is kept high.

Signal DTG=Vdd+Vth is given to copy PDC data into DDC. Thereafter, signal BLC=Vdd+Vth is given to copy TDC data into PDC. By doing so, the PDC data is moved to DDC; on the other hand, the DDC data is inverted, and thereafter, moved to PDC.

(Program Verify)

A program verify operation is substantially the same as the first embodiment. However, signal BLC=Vsg+Vth is given to obtain PDC=high; in other words, only bit line of write cell is pre-charged. During discharge of bit line, data of data cache is inverted to be restored in program recovery before the second time verify before or after the first time verify. In order to invert and restore data of data cache, the data of data cache is inverted according to the same operation as PDC data. However, if the data of data cache is inverted and restored after the first time verify, the DDC data is inverted. Other operation is the same as the first embodiment.

According to the second embodiment, only bit line of the write cell to be verified is pre-charged. Thus, current carrying the source line SRC is reduced to prevent the source line SRC from becoming a floating state. Therefore, current flows through the write cell to be verified, so that threshold voltage distribution is narrowed.

(Third Embodiment)

Figure 17:
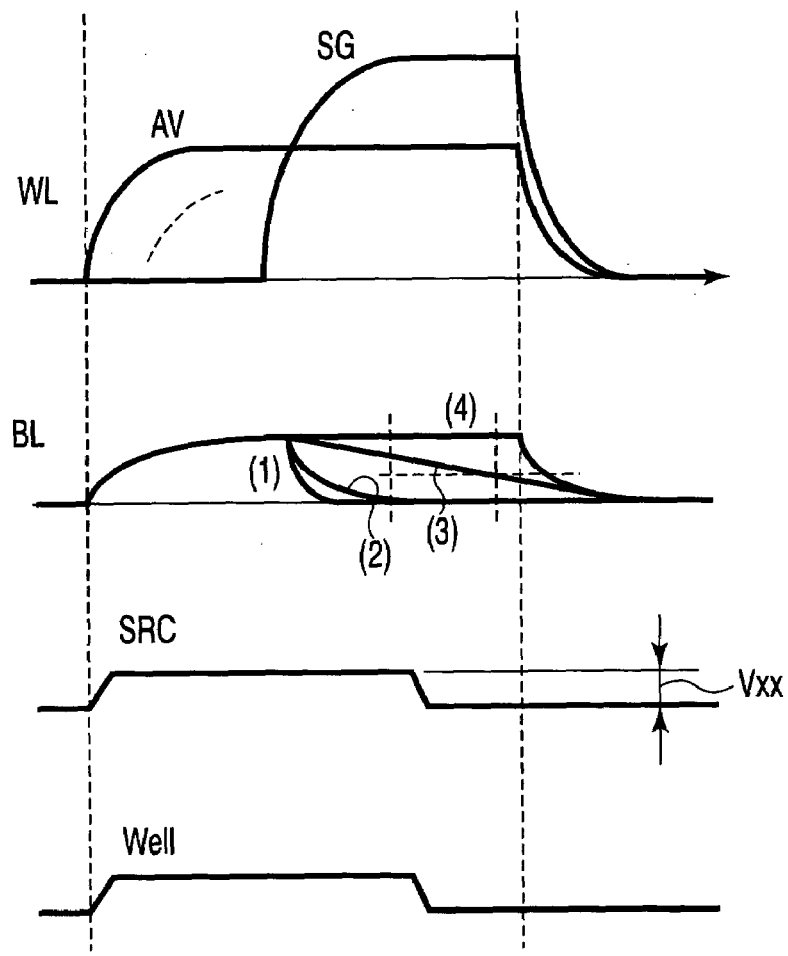
FIG. 17 is a waveform chart showing an operation of a third embodiment.

FIG. 17 shows an operation according to a third embodiment. In the foregoing first and second embodiments, the source line is set to Vss during bit line discharge in verify. As seen from FIG. 17, the potential of the source line SRC is set to Vxx (e.g., 0.2V) from program start to the first time verify. Potential supplied to cell seemingly becomes verify potential AV-Vxx. Therefore, this implies that the same potential as potential AVL lower than a normal verify potential AV is supplied, as shown in FIG. 1B. In this manner, the first time verify operation is carried out, and thereafter, the potential of the source line SRC is set to ground potential, and then, the second time verify operation is carried out.

According to the third embodiment, the capacity of the source line is smaller than that of the word line; therefore, a high-speed verify operation is possible.

In the third embodiment, the potential of source line only is set to Vxx (e.g., 0.2V), and thereby, the threshold voltage of cell slightly steps up according to back bias effect. In this case, the potential of well (not shown) formed with memory cell is set to Vxx (e.g., 0.2V), and thereby, it is possible to prevent a step-up of the threshold voltage of cell.

(Fourth Embodiment)

In the first to third embodiments, binary data is stored in the memory cell. The present invention is applicable to a multi-valued memory storing several bits in one cell.

FIG. 18 shows the configuration of a data storage circuit 10 applied to the case of storing ternary data. The data storage circuit 10 shown in FIG. 18 differs from that shown in FIG. 8 in the following point. Specifically, the data storage circuit 10 is further provided with SDC (secondary data cache), transistors 61n, 61o as a transfer gate for transferring a signal COMi, and transistor 61g.

Each row of the memory cell array 1 shown in FIG. 5 is provided with flag cells (not shown). The bit lie connected to the flag cells is connected to a flag cell data storage circuit. When second page data is written, each flag cell is stored with data showing that the second page data is written.

Figure 19:
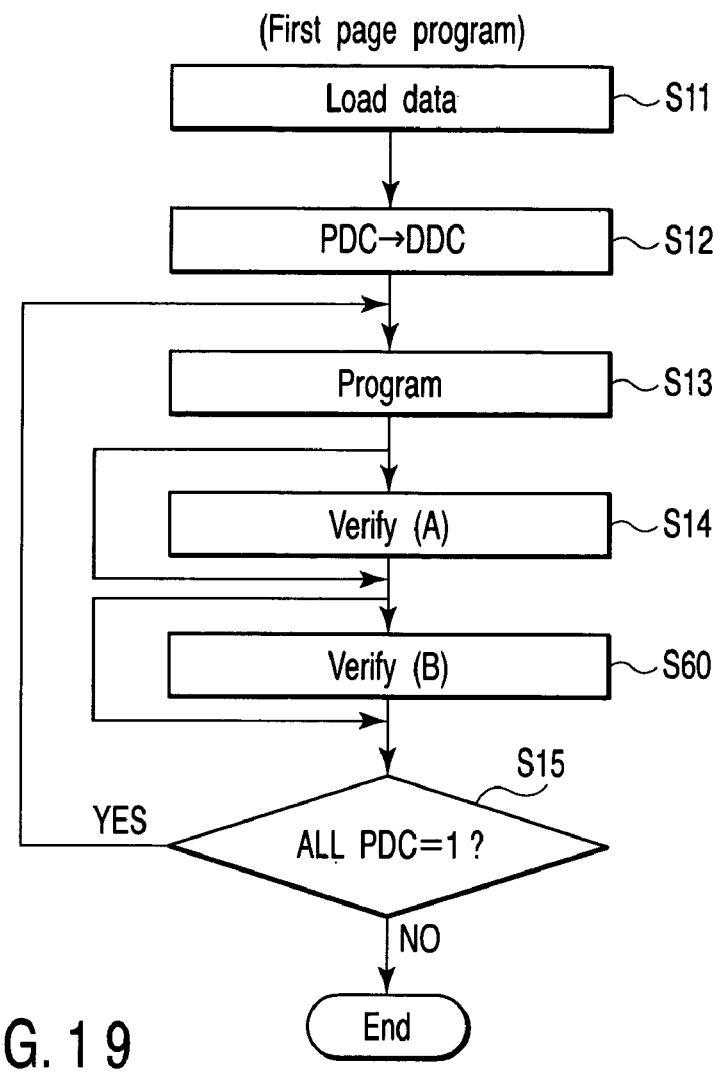
FIG. 19 is a flowchart to explain an operation according to a fourth embodiment.
Figure 20:
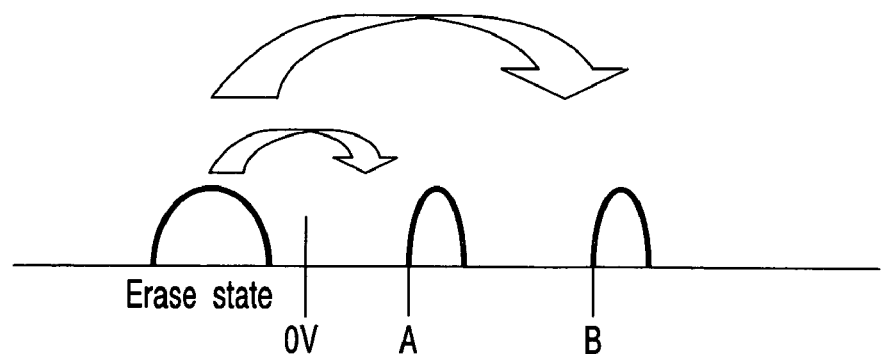
FIG. 20 is a view showing the operation of the fourth embodiment.

FIG. 19 shows the sequence for programming ternary data, and FIG. 20 shows a change of the threshold voltage of memory cell according to a program operation.

As depicted in FIG. 20, if ternary data is written, the cell threshold voltage is transferred from an erase state to level "A" or "B". For this reason, according to the fourth embodiment, verify at a verify level "A" (S14) and verify at a verify level "B" (S60) are carried out, as seen from FIG. 19. The verify at a verify level "B" is the same as the first to third embodiments. However, if verify of the cell written at the level "A" is carried out in the same manner as verify of the cell written at the level "B", the following problem arises. That is, a cell, which is written at the level "B" and does not reach the "B" level, passes the verify. Thus, if write at the level "B" is carried out during a write sequence, a node N2b of the SDC in the data storage circuit 10 shown in FIG. 18 is set high. On the other hand, if write at the level "A" is carried out, the node N2b is set low. In verify at the verify level "A", when the bit line potential is captured in TDC, the TDC becomes high. This is the case where the threshold voltage is higher than the level "A". For this reason, a signal BLC2 is set to Vth+0.1V so that TDC is forced low. By doing so, even if write at the level "B" is carried out, the TDC is set low not to pass the verify.

According to the fourth embodiment, it is possible to carry out the verify operation at high speed even if multi-valued data is stored.

(Fifth Embodiment)

Figure 21:
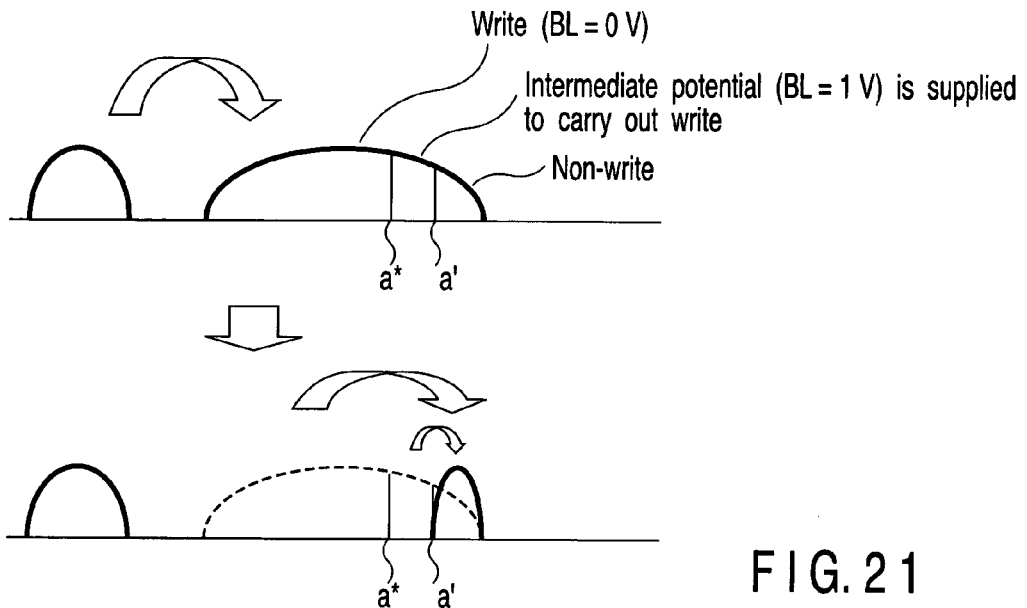
FIG. 21 is a view showing a program verify read operation.

According to the foregoing embodiments, the write speed is made late in the following manner in the program verify read operation. Specifically, as shown in FIG. 21, when the verify level exceeds a low verify level a* or current Icell flowing through cell is a little, an intermediate potential (e.g., 1V) is supplied to the bit line to make the write speed late.

Figure 22:
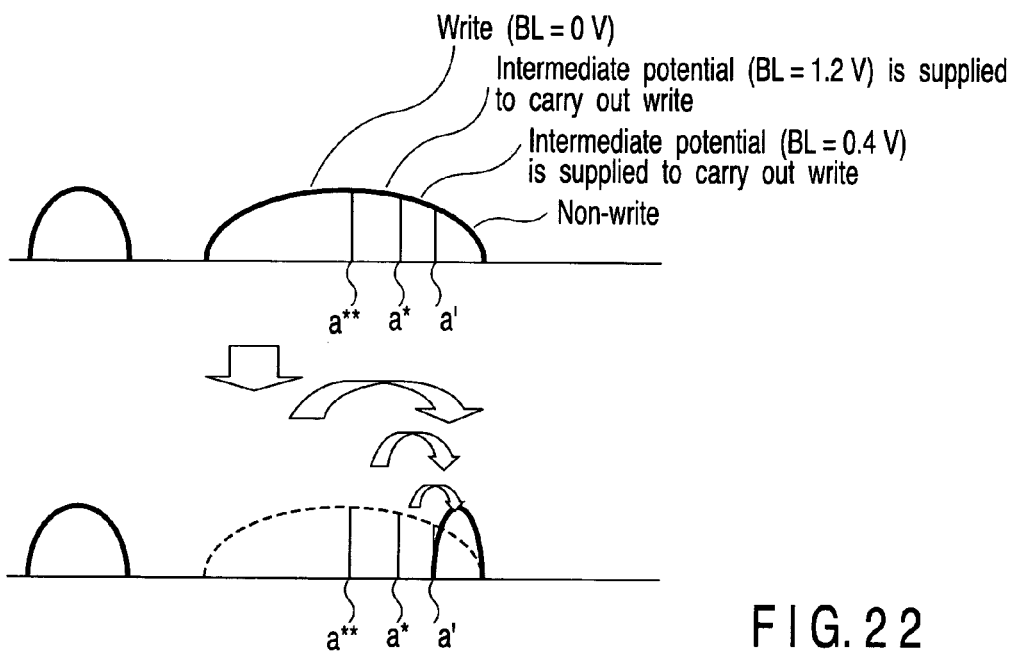
FIG. 22 is a view showing a program verify read operation according to a fifth embodiment.

On the contrary, according to the fourth embodiment, the write speed is made late in the following manner in the program verify read operation. Specifically, as shown in FIG. 22, when the verify level exceeds a low verify level a** or current Icell flowing through cell is a little, an intermediate potential (e.g., 1.2V) is supplied to the bit line to make the write speed late. Moreover, when the verify level exceeds a low verify level a* or current Icell flowing through cell is less than above, an intermediate potential (e.g., 0.4V) is supplied to the bit line to make the write speed later than above, and then, write is repeated. By doing so, threshold voltage distribution is narrowed.

Figure 23:
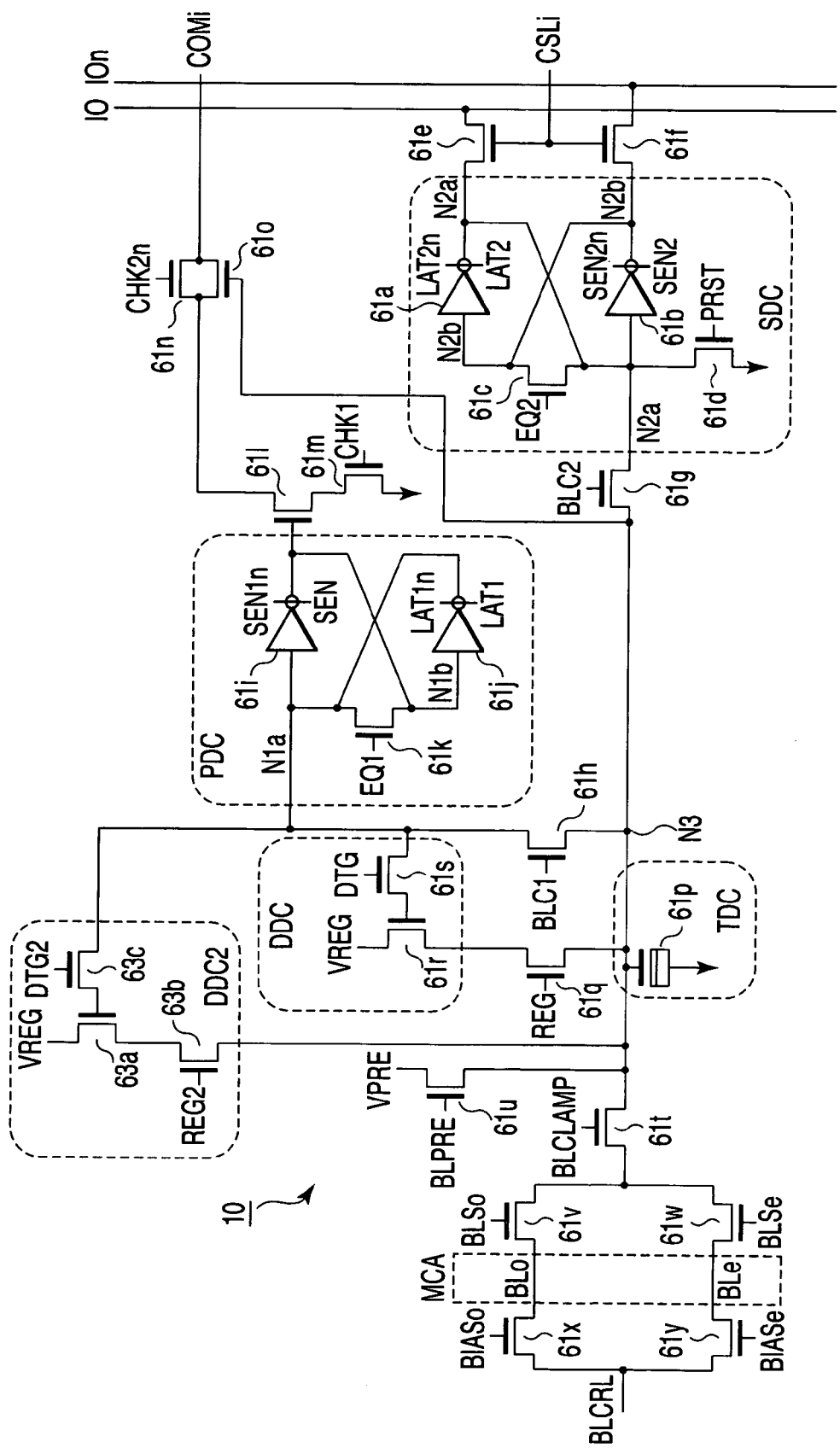
FIG. 23 is a circuit diagram showing the configuration of a data storage circuit applied to a fifth embodiment.

FIG. 23 shows the configuration of a data storage circuit 10 applied to the fifth embodiment. When the verify level exceeds verify level a**, a* and write or non-write state, data is stored in each of DDC, DDC2 and PDC.

In the fifth embodiment, two levels a** and a* are given; in this case, several levels may be given.

According to the fifth embodiment, the intermediate potential supplied to the bit line in a verify operation is increased. By doing so, the write speed is properly set, and threshold voltage distribution written to cell is narrowed. Moreover, the write speed is made late using several intermediate voltages; however, write time at one time is not so increased. Therefore, there is no hindrance to a high-speed program verify operation.

(Sixth Embodiment)

Figure 24:
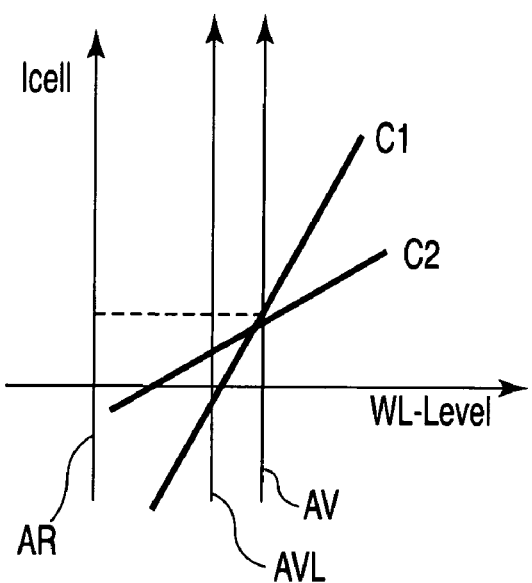
FIG. 24 is a view showing Log (I)-V characteristic.

In FIG. 1B, the potential of the word line WL is set to a potential AVL lower than a normal verify potential AV in verify, and thereafter, set to the normal verify potential AV. However, if the verify potential set as described above, the following problem arises. Specifically, in Log (I)-V characteristic, characteristic C2 having a gradient smaller than characteristic C1 is given resulting from reduction of cell current as shown in FIG. 24. In this case, current is carried even if the verify potential AVL is given. For this reason, the cell threshold voltage becomes higher than the threshold voltage (AV) of a write target.

In the foregoing first to fifth embodiments, the word line potential is unchanged in verify, and thereby, word line potentials in verify and read are made equal. By doing so, margin in read is reduced. In other words, the word line potential in verify is aligned with that in read.

Figure 25:
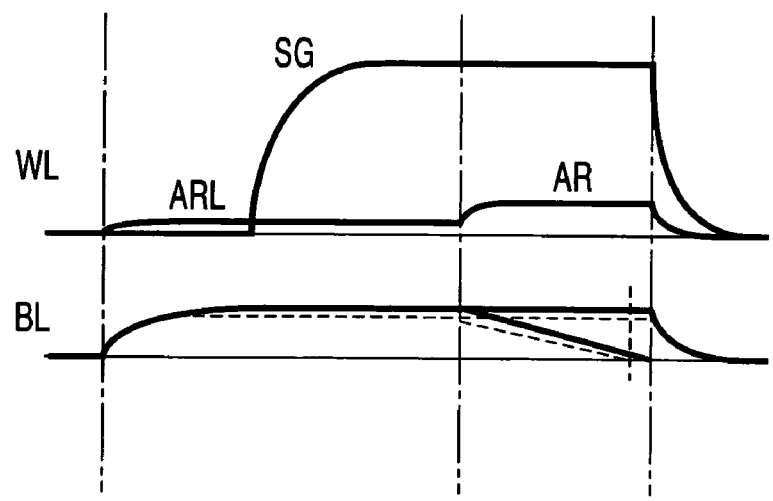
FIG. 25 is a waveform chart when a potential change of word line in a read operation according to a sixth embodiment is aligned with that in a verify operation.

On the contrary, according to the sixth embodiment, as shown in FIG. 25, the word line potential is changed in a read operation in the same manner as the verify operation shown in FIG. 1B. For example, the potential of the word line WL is set to a level (ARL) lower than an actual read level to discharge a current. Thereafter, the potential of the word line WL is set to an actual read level (AR). The foregoing operation is given, and thereby, read and verify operations are carried out under the same condition. Therefore, there is no need of widening margin in data read any more, and data stored in the memory cell is securely read.

(Seventh Embodiment)

Figure 26A:
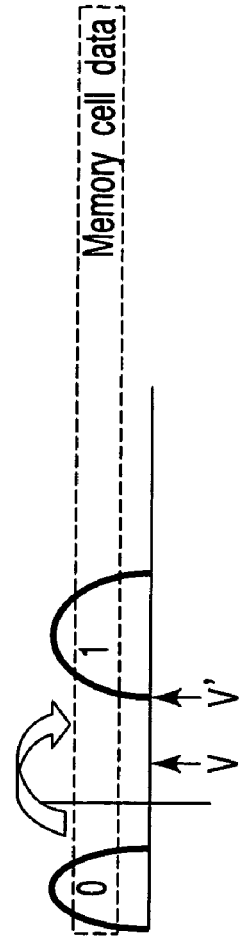
FIG. 26A, FIG. 26B and FIG. 26C are views to explain an operation of storing quaternary (four-valued) data according to a seventh embodiment.
Figure 26B:
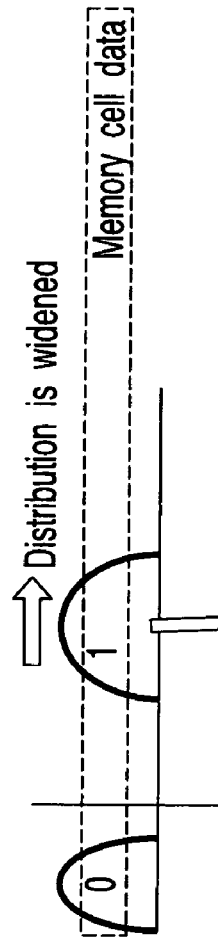
Figure 26C:
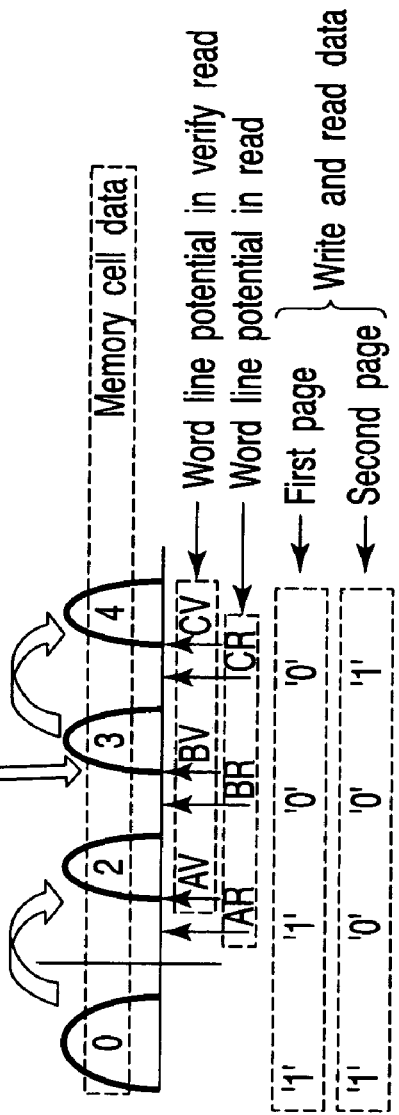
Figures 27, 28:
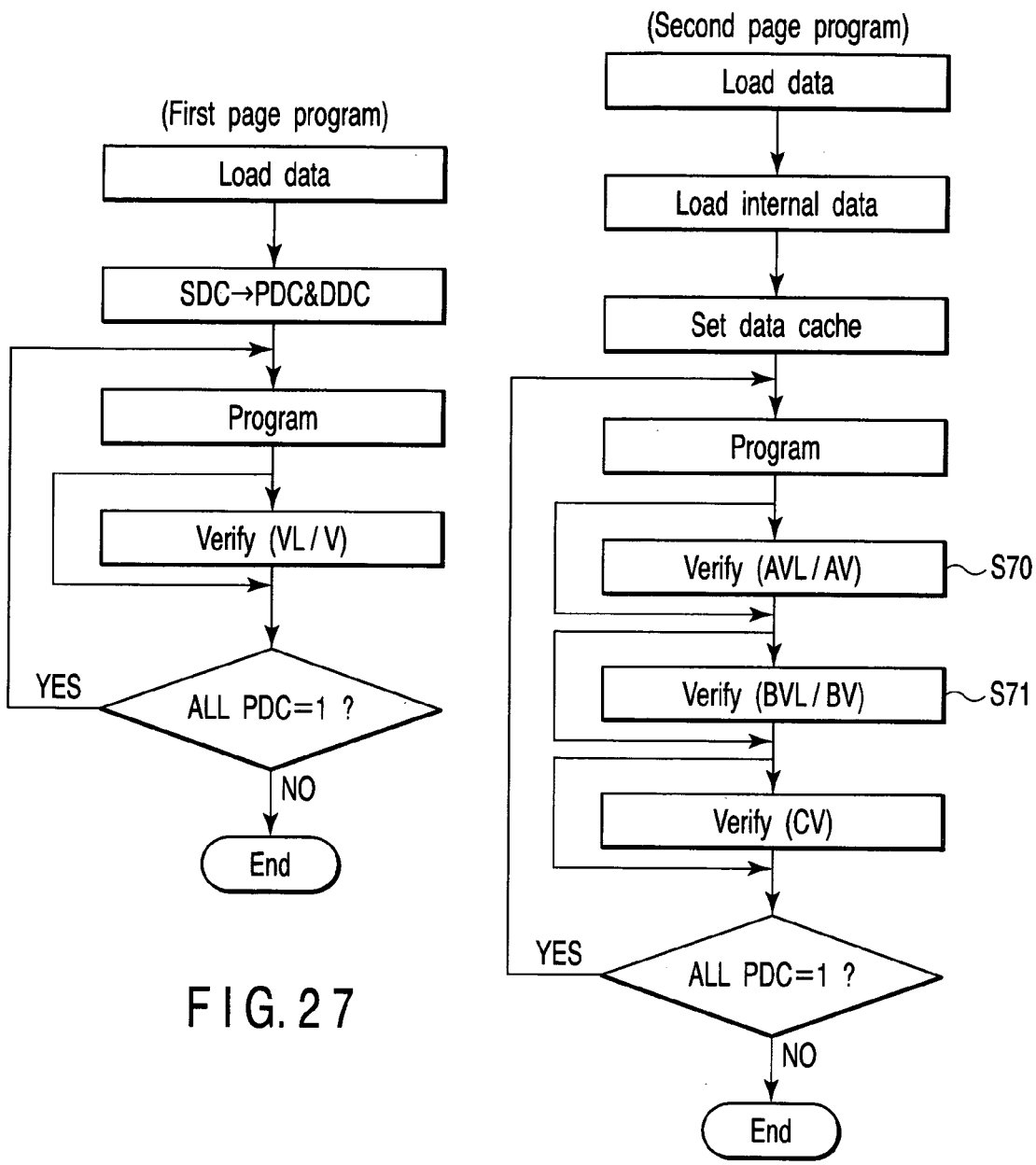
FIG. 27 is a flowchart to explain a first page program operation.
FIG. 28 is a flowchart to explain a second page program operation.

FIG. 26A, FIG. 26B and FIG. 26C show a write sequence of storing 2-bit data in one memory cell using quaternary (four-valued) data. FIG. 27 and FIG. 28 each show a flowchart to explain a quaternary (four-valued) write operation of changing a verify level. FIG. 27 shows a flowchart to explain a first page program operation, and FIG. 28 shows a flowchart to explain a second page program operation.

As shown in FIG. 26A, when an erase operation is carried out, memory cell data becomes "0". According to a first page write, the memory cell data is kept at "0" if data from the outside is non-write "1" while becoming "1" if data from the outside is write "0".

As depicted in FIG. 26C, in the second page write, the memory cell data is kept at "0" if the memory cell data is "0" and data from the outside is non-write "1". If data from the outside is write "0", the memory cell data becomes "2". If the memory cell data is "1" and data from the outside is non-write "1", the memory cell data becomes "4". If data from the outside is write "0", the memory cell data becomes "3".

In the first page write, threshold voltage distribution width may be large. Thus, as described in FIG. 24, in Log (I)-V characteristic, characteristic C2 having a gradient smaller than characteristic C1 is given resulting from reduction of cell current. For this reason, the cell threshold voltage becomes higher than the threshold voltage of a write target. But, this is no problem. However, in the second write, the threshold voltage distribution width must be narrowed. Specifically, as described in FIG. 24, in Log (I)-V characteristic, characteristic C2 having a gradient smaller than characteristic C1 is given resulting from reduction of cell current. As a result, cell carries current at the verify potential AVL. For this reason, the cell threshold voltage becomes higher than a write target the threshold voltage (AV), and thereby, the threshold voltage distribution width is widened. This results from the reason why the difference between verify potentials AVL and AV is narrow.

According to the second page program operation shown in FIG. 28, the first time verify is carried out in the following manner. Specifically, in verify (AVL/AV) (S70), the bit line is pre-charged, and simultaneously, the word line potential is set to a level AVL lower than a normal verify level AV, as shown in FIG. 1B Thereafter, the word line potential is set to a normal verify level AV, and then, the second time verify is carried out. In verify (BVL/BV) (S71), verify is carried out at a level BVL lower than a normal verify level BV and at the normal verify level AV, like the foregoing verify (AVL/AV).

Figure 29:
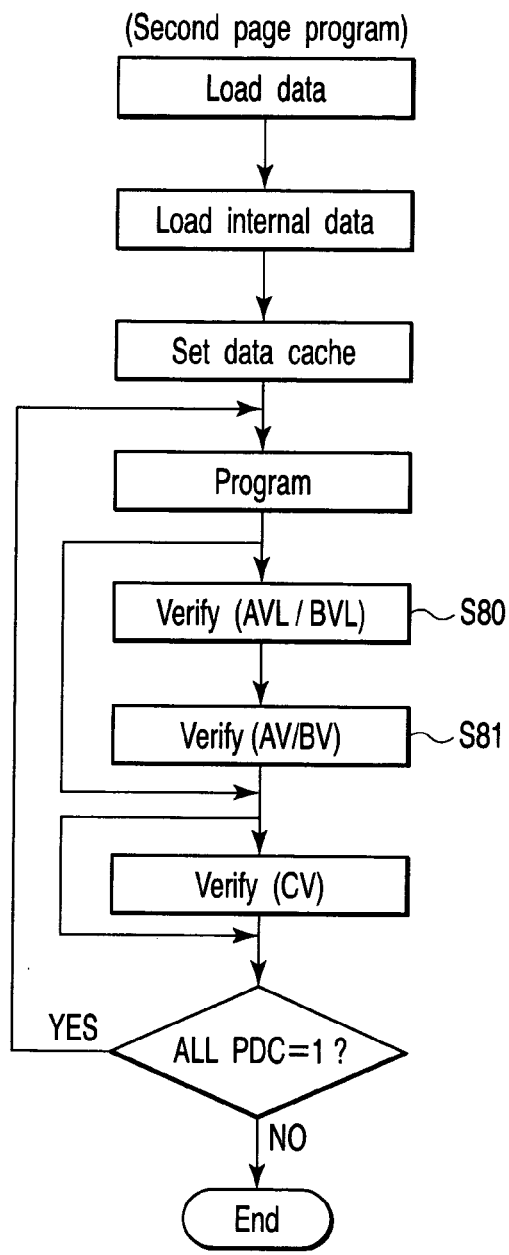
FIG. 29 is a flowchart to explain a second page program operation according to a seventh embodiment.
Figure 30:
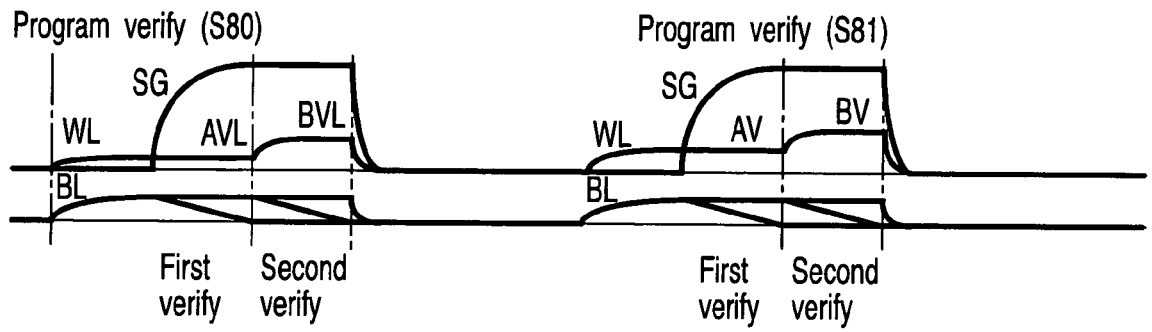
FIG. 30 is a waveform chart showing a second page program operation.

On the contrary, according to the seventh embodiment, verify is carried out in the following manner. According to the second page program shown in FIG. 29 and FIG. 30, in verify (AVL/BVL) (S80), only verify at a verify level lower than a normal verify level AV/BV is carried out.

First, the bit line is pre-charged, and simultaneously, the word line potential is set to AVL to carry out a first time verify operation at a level A is carried out. Thereafter, the word line potential is changed from AVL to BVL to carry out a second time verify operation a level B.

In verify (AV/BV) (S81), a verify operation is carried out at a normal verify level (AV/BV). Specifically, the bit line is pre-charged, and simultaneously, the word line potential is set to a level AV to carry out a first time verify operation at a level A. Thereafter, the word line potential is changed from AV to BV to carry out a second time verify operation at a level B. In this case, the potential difference between verify levels AVL and BVL and AV and between BV is large; therefore, no problem described in FIG. 24 arises. Thus, the threshold voltage distribution is narrowed, and high-speed write is achieved.

Figure 31:
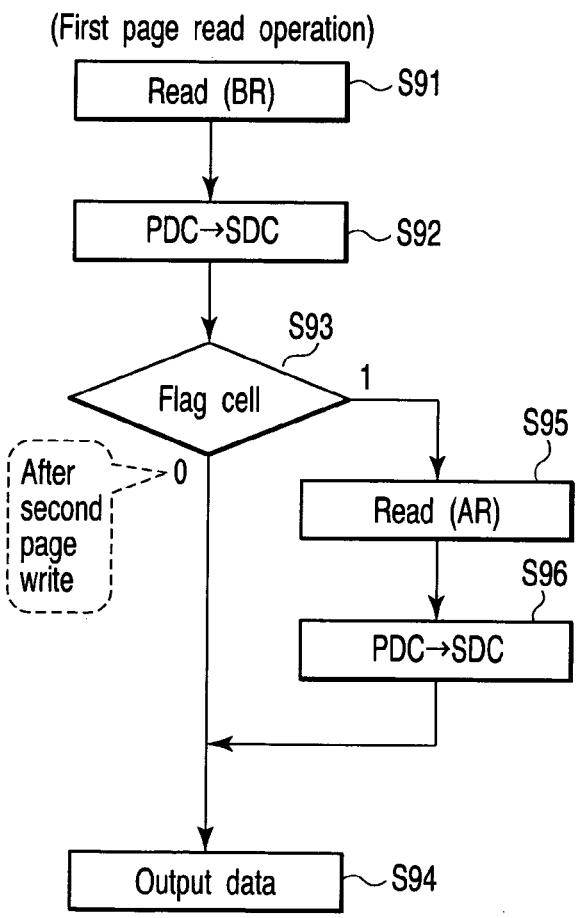
FIG. 31 is a flowchart to explain a first page read operation of changing a verify level.
Figures 32, 33:
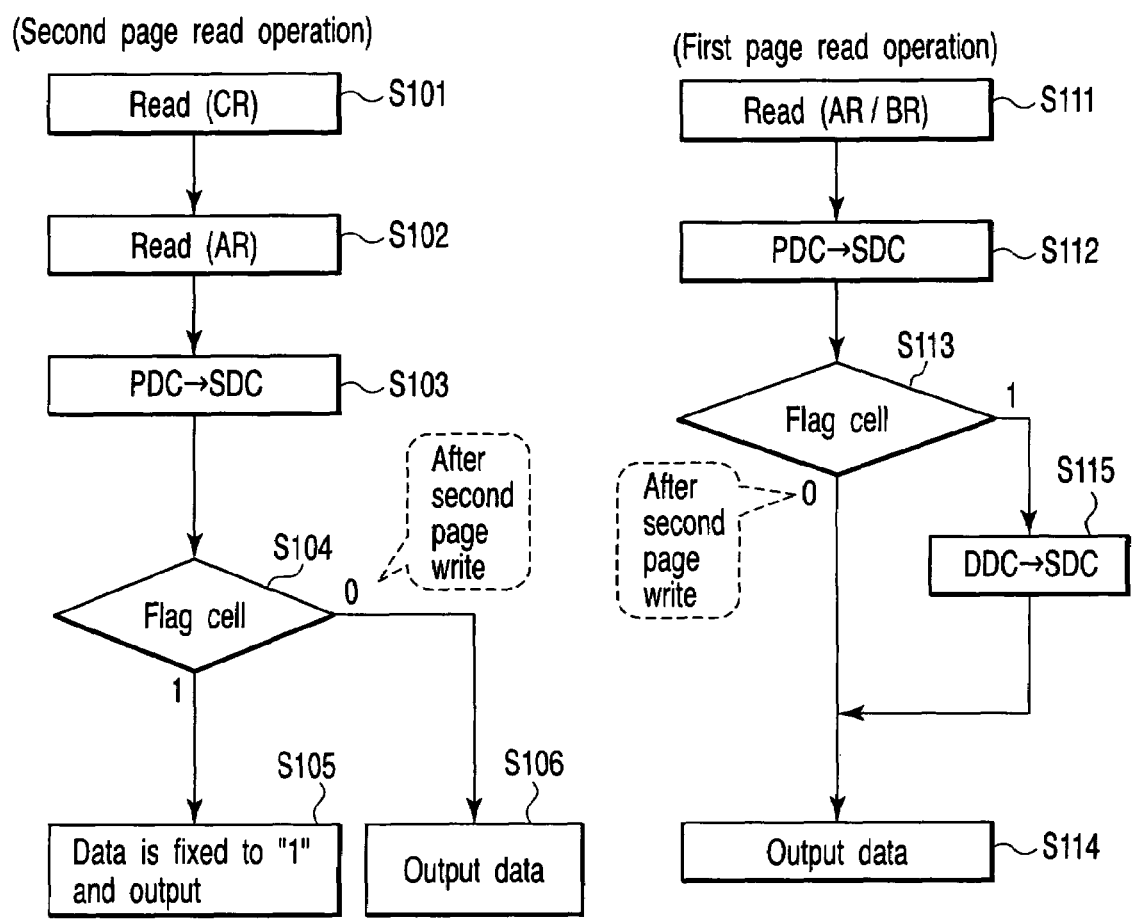
FIG. 32 is a flowchart to explain a second page read operation when the verify level is changed and unchanged.
FIG. 33 is a flowchart to explain a first page read operation according to a seventh embodiment.

FIG. 31 and FIG. 32 each show a flowchart to explain a read operation of changing a verify level. FIG. 31 shows a first page read operation, and FIG. 32 shows a second page read operation.

According to the first page read operation shown in FIG. 31, data is read at a read level BR (S91). The read result is transferred from PDC to SDC (S92). Thereafter, flag cell data (written only when second page write is carried out) for identifying whether or not second page write is made is determined (S93). If data is written in the flag cell, the data is outputted (S94). On the other hand, if data is not written in the flag cell (no write is made with respect to second page), data is again read at a read level BAR to output data outside (S95, S96, S94).

Figure 34:
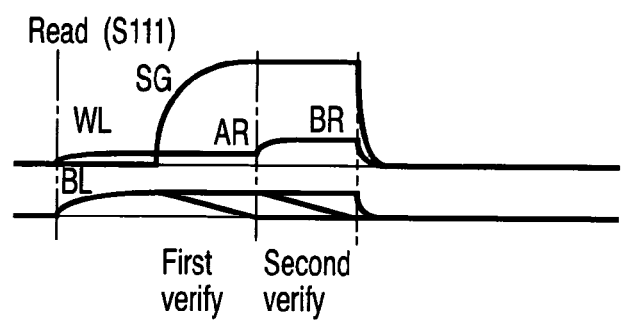
FIG. 34 is a waveform chart showing the first page read operation according.

On the contrary, according to a first page read operation of the seventh embodiment, a read operation at read levels AR and BR is carried out in the same manner as the verify operation, as shown in FIGS. 33 and 34. Specifically, the bit line is pre-charged one time, and thereafter, the word line potential is set to AR to read data, and thereafter, the word line potential is again set to BR to read data (S111). By doing so, the operation in verify and read is carried out under the same condition. Thus, there is no need of widening data read margin any more, and data stored in the memory cell is securely read. In this case, the read result at the read level AR is held in the DDC; on the other hand, the read result at the read level BR is held in the PDC.

Thereafter, data is transferred from PDC to SDC (S112). Flag cell for identifying whether or not the second page write is carried out is determined (S113). As a result, if the flag cell is written, the data is output (S114). On the other hand, if data is not written in the flag cell (no write is made with respect to the second page), the read result at the read level AR held in the DDC is transferred to SDC (S115) to output data outside (S114).

According to the seventh embodiment, the following advantage is given. That is, if no second page write is carried out in the first page read, two-time read sequences are required; on the contrary, one-time read sequence is only carried out. Therefore, a high-speed read is achieved.

In the first page read operation, the second page read sequence is the same in cases where the word line potential is changed or not changed after one-time pre-charge. Specifically, as shown in FIG. 32, the bit line is pre-charged, and thereafter, the word line potential is set to CR to read data from memory cell (S101). Thereafter, the bit line is pre-charged, and thereafter, the word line potential is set to BAR to read data from memory cell (S102). Then, PDC data is transferred to SDC (S103). Thereafter, flag cell data is determined (S104). As a result, if no write is made with respect to the second page, data is fixed to "1", and then output (S105). On the other hand, if write is made with respect to the second page, SDC data is output (S106).

Figure 35:
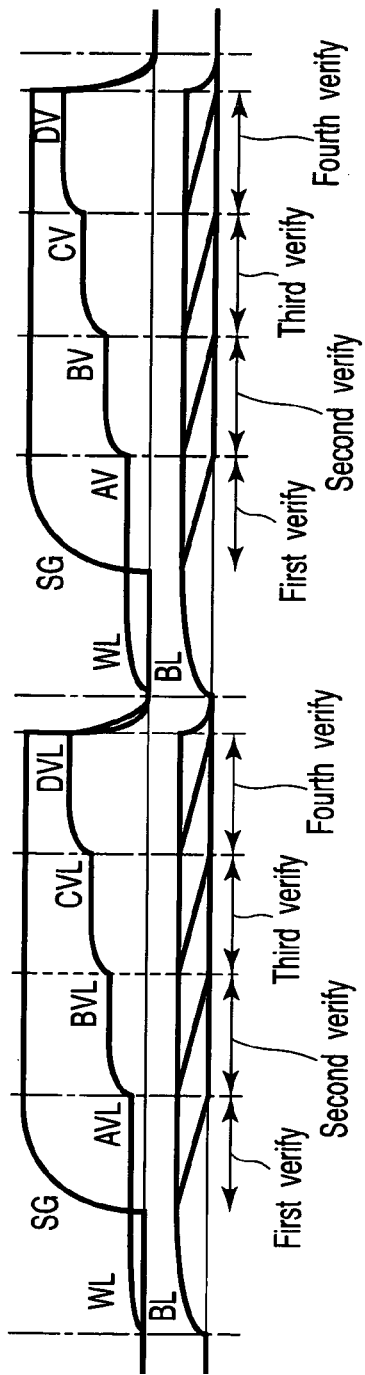
FIG. 35 is a waveform chart showing a modification example of the seventh embodiment.

FIG. 35 shows a modification example of the seventh embodiment. FIG. 35 shows an operation of continuously reading four levels after a bit line is pre-charged. Specifically, the bit line BL is pre-charged, and thereafter, the word line WL is successively supplied with several different low verify voltages AVL, BVL, CVL and DVL. These verify voltages AVL, BVL, CVL and DVL are supplied to continuously carry out low first to fourth verify. Thereafter, the bit line BL is again pre-charged, and thereafter, the word line WL is successively supplied with several different normal verify voltages AV, BV, CV and DV. These normal verify voltages AV, BV, CV and DV are supplied to continuously carry out normal first to fourth verify.

According to the foregoing modification example, four-time verify is carried out with respect to one-time bit line pre-charge. Therefore, the number of pre-charging the bit line is reduced, and four-valued data write is achieved at high speed.

(Eighth Embodiment)

Figure 36:
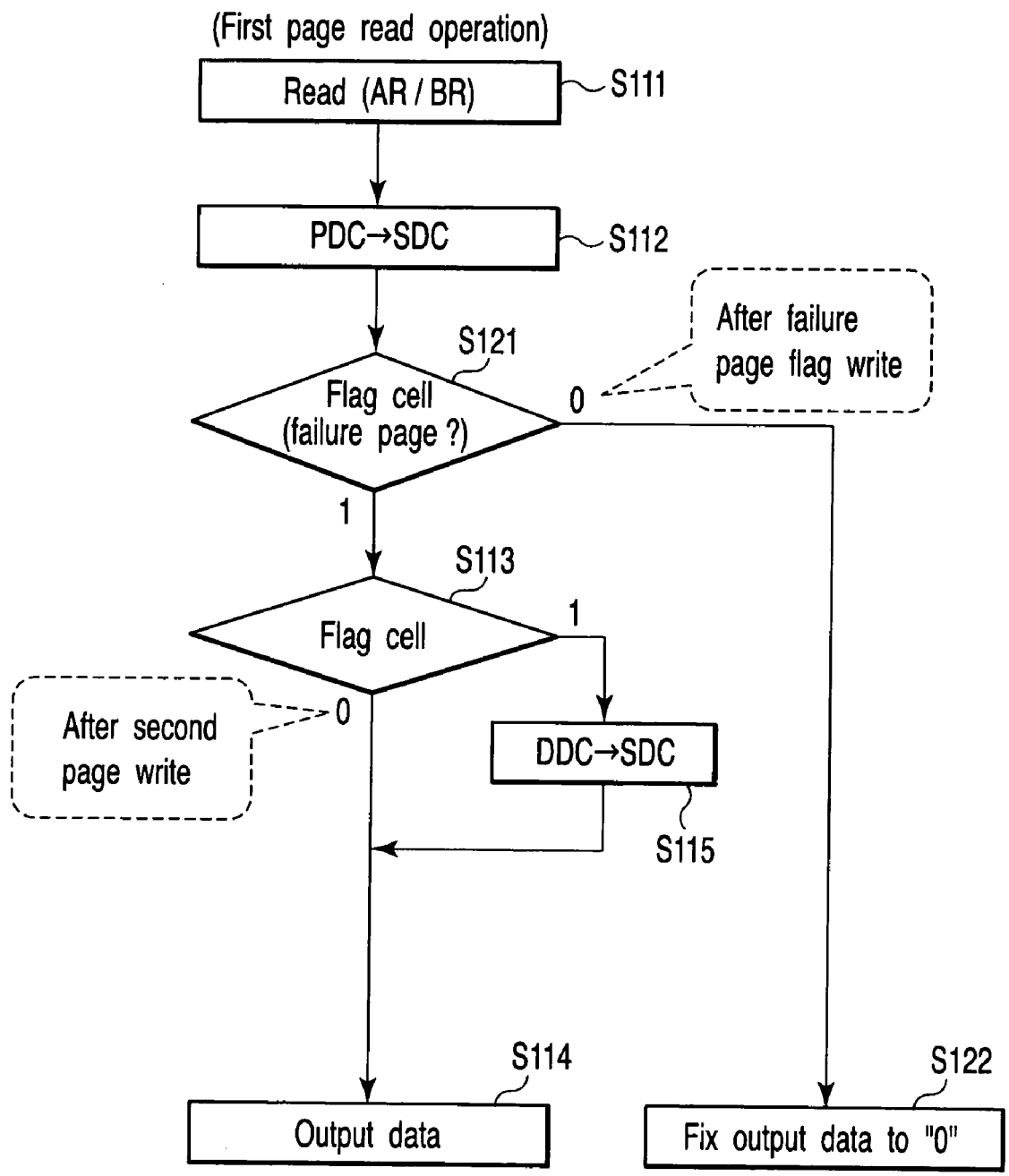
FIG. 36 is a waveform chart showing a first page read operation according to an eighth embodiment.
Figure 37:
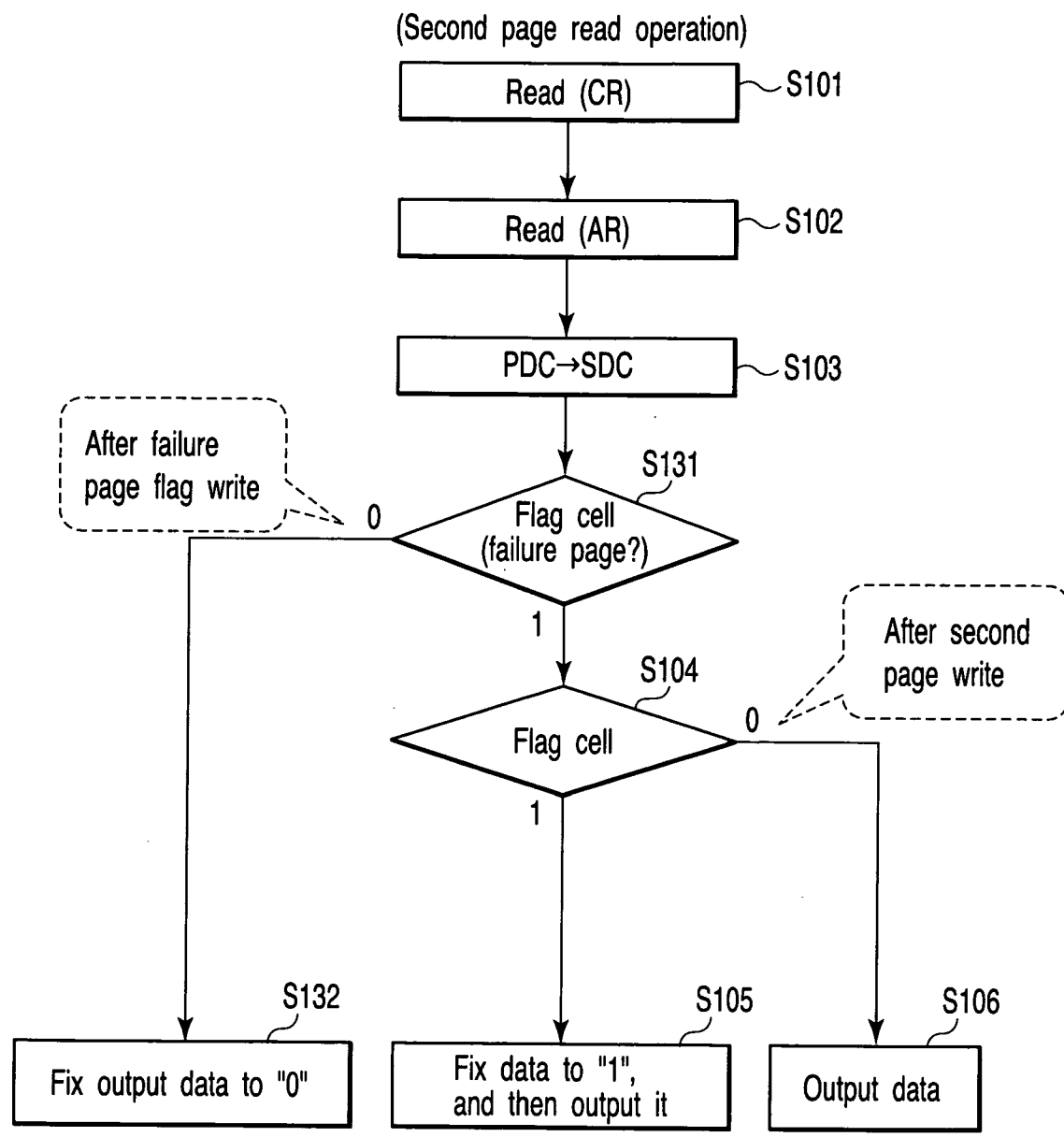
FIG. 37 is a waveform chart showing a second page read operation according to an eighth embodiment.

FIG. 36 and FIG. 37 each show an eighth embodiment modifying the seventh embodiment. In FIG. 36, the same reference numerals are used to designate portions identical to FIG. 33. In FIG. 37, the same reference numerals are used to designate portions identical to FIG. 32.

According to the eighth embodiment, the memory cell array is further provided with another flag cell. It is recognizable whether failure occurs in page using data stored in the flag cell. Specifically, each row of the memory cell array 1 shown in FIG. 5 is provided with a flag cell (not shown). A bit line connected to the flag cell is connected with a flag cell data storage circuit. The foregoing configuration is given, and thereby, if failure occurs in page, data is written in the flag cell corresponding to the failure page. If failure occurs in first page write, data showing failure page corresponding to the first page, for example, "0" is written in the flag cell. Moreover, failure occurs in second page write, data showing failure page corresponding to the second page, for example, "0" is written in the flag cell.

In the first page read shown in FIG. 36, it is determined whether or not data "0" showing failure page is written in the first page of the flag cell (S121). As a result, if no data showing failure page is written, data is output as described before. On the other hand, if data showing failure page is written, all output data of the first page are fixed to "0" (S122). By doing so, it is recognizable that the first page is failure page.

In the second page read shown in FIG. 37, it is determined whether or not data "0" showing failure page is written in the second page of the flag cell (S131). As a result, if no data showing failure page is written, data is output as described before. On the other hand, if data showing failure page is written, all output data of the first page are fixed to "0" (S132). By doing so, it is recognizable that the first page is failure page.

The flag for identifying failure page is set independently from first and second pages. The first and second pages are the same cell. For this reason, for example, if the first page is failure, there is the case where the second page is also failure. Therefore, only one flag for identifying failure page is set. If write is made with respect to the flag, output data is fixed in both first and second page.

In the foregoing fifth to seventh embodiments, the bit line potential is read in the following manner. Specifically, as shown in FIG. 1B, the bit line is one pre-charged to rise up the word line, and thereafter, the select gate is powered on to carry out the first time read of the bit line potential. Then, the word line potential is changed to carry out the second time read of the bit line potential.

Figure 38:
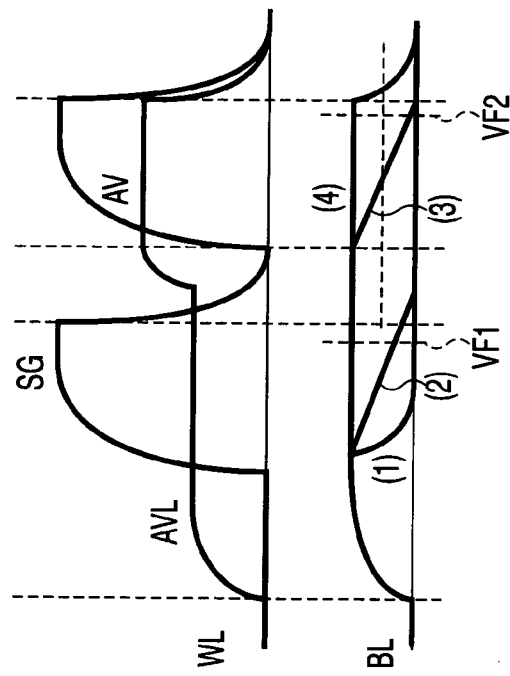
FIG. 38 is a waveform chart showing word line and bit line potentials according to a modification example of the fifth to seventh embodiments.

On the other hand, as depicted in FIG. 38, the bit line BL is one pre-charged to rise up the word line to a potential AVL. Thereafter, the select gate SG is powered on to carry out the first time read of the bit line potential. Then, the select gate SG is powered off to change the word line potential to AV, and thereafter, the select gate SG is again powered on to carry out the second time read of the bit line potential. By doing so, in the word line having large capacity and resistance, the rise speed of the word line serves to prevent the difference of discharge speed of the bit line resulting from the difference between proximal and tip ends of the word line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell storing data using n threshold voltage (n: natural number more than 1);
a voltage supply circuit supplying a predetermined voltage to a gate of the memory cell in a verify operation of verifying whether or not the memory cell reaches a predetermined threshold voltage; and
a detection circuit connected to one terminal of the memory cell, the detection circuit charging one terminal of the memory cell to a predetermined potential in the verify operation, detecting a voltage of one terminal of the memory cell at a first detection timing, and detecting a voltage of one terminal of the memory cell at a second detection timing.

2. The device according to claim 1, wherein a threshold level of the memory cell detected at the first detection timing is higher than a threshold level of the memory cell detected at the second detection timing.

3. The device according to claim 1, wherein the memory cell stores binary or more data.

4. The device according to claim 1, further comprising:
a write circuit supplying a ground potential to one terminal of the memory cell to carry out a write operation with respect to a memory cell whose one terminal has a level lower than the threshold level detected at the second detection timings,
carrying out write wherein a change in threshold voltage is smaller than a change of a threshold voltage by the write operation, with respect to a memory cell whose one terminal has a level higher than the threshold level detected at the second detection timing and lower than the threshold level detected at the first detection timing, and
carrying out no write with respect to a memory cell whose one terminal has a level higher than the threshold level detected at the first detection timing.

5. A semiconductor memory device comprising:
a memory cell storing data using n threshold voltage (n: natural number more than 1);
a first data storage circuit connected to one terminal of the memory cell, and storing first or second logic level data inputted externally;
a second data storage circuit connected to one terminal of the memory cell, and storing the first or second logic level data; and
a control circuit connected to the first and second data storage circuits,
the control circuit carrying out the following:
a first operation of stepping up the threshold voltage of the memory cell when the first and second data storage circuits are a first logic level;
a second operation of stepping up the threshold voltage of the memory cell in a range of the threshold voltage less than the first operation when the second data storage circuits is a second logic level;
an operation of charging one terminal of the memory cell while applying a first voltage to a gate of the memory cell in a verify operation of holding the threshold voltage of the memory cell without changing it and verifying whether or not the memory cell reaches a predetermined threshold voltage when the first data storage circuits is a second logic level; and
the first operation in a manner of changing the logic level of the second data storage circuit to a second logic level when the voltage of one terminal of the memory cell is more than a first detection level in a first step, and after predetermined time elapses, changing the logic level of the first data storage circuit to a second logic level when the voltage of one terminal of the memory cell is more than a second detection level in a second step.

6. The device according to claim 5, wherein the first detection level is higher than the second detection level.

7. The device according to claim 5, wherein the control circuit carries out the first and second steps in a manner of charging one terminal of the memory cell while applying a second voltage to a gate of the memory cell like the verify operation in a data read operation.

8. The device according to claim 5, wherein the first voltage supplied to the gate of the memory cell is higher than the second voltage supplied to the gate of the memory cell in read.

9. The device according to claim 5, wherein the first detection level has different value for each memory cell.

10. The device according to claim 5, wherein the first step is carried out at different timing for each memory cell.

11. The device according to claim 5, wherein the control circuit has a counter counting write count, and changes the first detection level when an average value of the write count counted by the counter is more than a predetermined value.

12. The device according to claim 5, wherein the control circuit has a first counter counting write count, and changes a timing of the first step when an average value of the write count counted by the first counter is more than a predetermined value.

13. The device according to claim 5, wherein the other terminal of the memory cell is supplied with a third voltage in the first step, and supplied with a fourth voltage in the second step.

14. The device according to claim 12, wherein a well of the memory cell is supplied with the third voltage in the first step.

15. The device according to claim 13, wherein the third voltage is higher than the fourth voltage.

16. The device according to claim 5, wherein in a verify operation of verifying whether or not the memory cell reaches a threshold voltage, one terminal of the memory cell is charged when the first data storage circuits is a first logic level, while no charge is made when it is a second logic level.

17. The device according to claim 5, wherein the control circuit has a second counter, which counts an erase count of the memory cell and whose count value is stored in the memory cell, and changes the first detection level when the erase count stored in the memory cell is more than a predetermined value.

18. The device according to claim 5, wherein the control circuit has a second counter, which counts an erase count of the memory cell and whose count value is stored in the memory cell, and changes a timing of the first step when the erase count stored in the memory cell is more than a predetermined value.

19. A semiconductor memory device comprising:
a memory storing several data using n threshold voltage (n: natural number more than 1);
a first data storage circuit connected to one terminal of the memory cell, and storing first or second logic level data inputted externally; and
a control circuit connected to the first data storage circuit, the control circuit carrying out a first operation of stepping up the threshold voltage of the memory cell when the first data storage circuits is a first logic level, charging one terminal of the memory cell when the first data storage circuit is a first logic level while applying a first voltage to a gate of the memory cell without making no charge operation when it is second level in a verify operation of holding the threshold voltage of the memory cell without changing it and verifying whether or not the memory cell reaches a predetermined threshold voltage when the first data storage circuits is a second logic level, and making no first operation in a manner of changing the logic level of the first data storage circuit to a second level when the voltage of one terminal of the memory cell is more than a first detection level.

20. A program method of a semiconductor memory device comprising:
carrying out a write operation with respect to a memory cell storing data using different threshold voltage, and making no change of a threshold voltage in a next write operation when the memory cell reaches a predetermined first threshold voltage in a verify operation of and verifying whether or not the memory cell reaches a predetermined first threshold voltage; and
carrying out an i (i: natural number more than 3) write operation in the next write operation when the memory cell reaches a voltage lower than the predetermined first threshold voltage, that is, i threshold voltage (i: natural number more than 3) (first threshold voltage>second threshold voltage>third threshold voltage . . . >i threshold voltage), and controlling the threshold voltage in the i write operation so that a change becomes small in the order of first threshold voltage<third threshold voltage<fourth threshold voltage< . . . <k threshold voltage, and repeating the write operation and the verify operation until the memory cell reaches the predetermined first threshold voltage.

21. The method according to claim 20, wherein in the i write operation, a bit line is supplied with i potential (second potential>third potential> . . . >i potential) to carry out write.

22. The method according to claim 21, wherein the predetermined first threshold voltage includes several threshold voltages to store several data.

23. A semiconductor memory device comprising:
a memory cell array having several memory cells arrayed like a matrix, which are connected to a word line and a bit line and store n value (n: natural number more than 3); and
a control circuit controlling each potential of the word line and the bit line in accordance with input data, and writing data in the memory cell,
the control circuit carrying out write using k value (k<=n) in the write operation,
charging the bit line, and thereafter, changing the word line potential m times to verify whether or not the memory cell reaches a normal m threshold value (m<=k), and
charging the bit line in j value (j<=n) data read, and thereafter, changing a voltage supplied to the word line m times same as the verify operation to carry out a read operation.

24. A semiconductor memory device comprising:
a memory cell array having several memory cells arrayed like a matrix, which are connected to a word line and a bit line and store n value (n: natural number more than 3); and
a control circuit controlling each potential of the word line and the bit line in accordance with input data, and writing data in the memory cell,
the control circuit carrying out write using k value (k<=n) in the write operation, and charging the bit line, thereafter, changing the word line potential m times to verify whether or not the memory cell reaches a normal m threshold value (m<=k),
charging the bit line again, thereafter, changing the word line potential m times to verify whether or not the memory cell reaches a normal m threshold value (m<=k), and in the next write operation, making a write speed late when the memory cell reaches the normal m threshold value while carrying out no write operation when it reaches the normal m threshold value.

25. The method according to claim 24, further comprising:
charging the bit line in j value (j<=n) data read, and thereafter, changing a voltage supplied to the word line m times same as the verify operation to carry out a read operation.

26. A semiconductor memory device comprising:
a memory cell array storing n value (n: natural number more than 2), and having at least one first memory cell arrayed like matrix and at least one second memory cell selected simultaneously with the first memory cell,
the memory cell array outputting data of the first memory cell when a logic level of the second memory cell is a first logic level, and outputting output data of the first memory cell as a fixed value when the logic level of the second memory cell is a second logic level.

* * * * *